(12) United States Patent
Murano et al.

(10) Patent No.: US 12,393,077 B2
(45) Date of Patent: Aug. 19, 2025

(54) OPTICAL LAMINATE AND METHOD OF PRODUCING THE OPTICAL LAMINATE

(71) Applicant: Sumitomo Chemical Company, Limited, Tokyo (JP)

(72) Inventors: Kota Murano, Osaka (JP); Nobuyuki Hatanaka, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 18/116,457

(22) Filed: Mar. 2, 2023

(65) Prior Publication Data

US 2023/0288751 A1    Sep. 14, 2023

(30) Foreign Application Priority Data

Mar. 8, 2022    (JP) ................. 2022-035431

(51) Int. Cl.
| | |
|---|---|
| *G02F 1/1335* | (2006.01) |
| *G02B 5/30* | (2006.01) |
| *G02F 1/13363* | (2006.01) |
| *G02F 1/1337* | (2006.01) |

(52) U.S. Cl.
CPC ..... *G02F 1/133533* (2013.01); *G02B 5/3091* (2013.01); *G02F 1/133638* (2021.01); *G02F 1/133788* (2013.01)

(58) Field of Classification Search
CPC ......... G02F 1/133533; G02F 1/133638; G02F 1/133788; G02B 5/3091
See application file for complete search history.

(56) References Cited

U.S. PATENT DOCUMENTS

| | | | | |
|---|---|---|---|---|
| 2018/0017724 | A1* | 1/2018 | Nam | G02F 1/133528 |
| 2021/0026199 | A1* | 1/2021 | Fukagawa | C09B 57/007 |
| 2021/0408496 | A1* | 12/2021 | Choi | H10K 50/86 |
| 2022/0059806 | A1* | 2/2022 | Ko | H10K 59/38 |
| 2024/0069264 | A1* | 2/2024 | Yoshinari | H05B 33/02 |

FOREIGN PATENT DOCUMENTS

| | | | | |
|---|---|---|---|---|
| KR | 20170063289 A | * | 6/2017 | G02F 1/133528 |
| WO | 2020121907 A1 | | 6/2020 | |

* cited by examiner

*Primary Examiner* — Nathanael R Briggs
(74) *Attorney, Agent, or Firm* — Panitch Schwarze Belisario & Nadel LLP

(57) ABSTRACT

Provided is an optical laminate including an optically anisotropic layer having at least two regions having different visibility correction transmittances, in which the visibility correction transmittance in a region having a high transmittance is further improved. An optical laminate including: at least a first region and a second region having different values of visibility correction transmittance; and a protective layer having a thickness of 5 μm or less, an orientation layer, and a light absorption anisotropic layer provided in this order, wherein the second region is a region in which the visibility correction transmittance is higher than that of the first region, and the light absorption anisotropic layer is a layer including a liquid crystal composition containing a dichroic dye, and includes the first region and the second region.

8 Claims, 2 Drawing Sheets

OPTICAL LAMINATE AND METHOD OF PRODUCING THE OPTICAL LAMINATE

CROSS-REFERENCE TO RELATED APPLICATIONS

This application claims priority under 35 U.S.C. § 119 (b) to Japanese Application No. 2022-035431, filed Mar. 8, 2022, the disclosure of which is incorporated herein by reference in its entirety.

BACKGROUND OF THE INVENTION

Field of the Invention

The present invention relates to an optical laminate and a method of producing the optical laminate.

Description of the Related Art

An organic EL display device using an organic light emitting diode (OLED) not only can be made lighter and thinner than a liquid crystal display device and the like, but also can achieve high image quality such as a wide viewing angle, a fast response speed, and high contrast, and thus, is used in various fields such as a smartphone, a television, and a digital camera. In the organic EL display device, a circularly polarizing plate is used in order to suppress a decrease in visibility due to light reflection at an electrode constituting the device and reflection of external light.

As a polarizing film used for such a circularly polarizing plate, WO 2020/121907 A discloses a patterned polarizing film in which a patterned polarizing layer is stacked on a base material.

SUMMARY OF THE INVENTION

The patterned polarizing film disclosed in WO 2020/121907 A is produced by forming a layer (polarizing layer) including a liquid crystal composition containing a dichroic dye on a base material layer with an orientation layer interposed therebetween, and then forming a region having a high visibility correction transmittance by laser irradiation. However, the studies of the present inventors have revealed that when pattern formation is performed by laser irradiation as described above, the visibility correction transmittance in a laser irradiated region may not be sufficiently enhanced due to deposition of a part of the dichroic dye on the base material layer.

An object of the present invention is to provide an optical laminate including an optically anisotropic layer having at least two regions having different visibility correction transmittances, in which the visibility correction transmittance in a region having a high transmittance is further improved.

As a result of diligent studies to solve the above problems, the present inventors have completed the present invention. That is, the present invention includes the following aspects.

[1] An optical laminate including:
  at least a first region and a second region having different values of visibility correction transmittance; and
  a protective layer having a thickness of 5 μm or less, an orientation layer, and a light absorption anisotropic layer provided in this order,
  wherein the second region is a region in which the visibility correction transmittance is higher than that of the first region, and
  the light absorption anisotropic layer is a layer including a liquid crystal composition containing a dichroic dye, and includes the first region and the second region.

[2] The optical laminate according to [1], wherein both the first region and the second region include a layer configuration including the protective layer having a thickness of 5 μm or less, the orientation layer, and the light absorption anisotropic layer in this order.

[3] The optical laminate according to the above [1] or [2], wherein
  the second region is a region having a circular, elliptical, oval, or polygonal shape in plan view,
  a diameter is 2 cm or less when the second region has a circular shape,
  a major diameter is 2 cm or less when the second region has an elliptical shape or an oval shape is 2 cm or less, and
  when the second region has a polygonal shape, a diameter of a virtual circle drawn such that the polygon is inscribed is 2 cm or less.

[4] The optical laminate according to any one of [1] to [3], wherein the visibility correction transmittance in the first region is 35% or more.

[5] The optical laminate according to any one of [1] to [4], wherein the visibility correction transmittance in the second region is 87% or more.

[6] The optical laminate according to any one of [1] to [5], wherein the first region shows a Bragg peak in X-ray diffractometry.

[7] The optical laminate according to any one of [1] to [6], wherein the orientation layer contains a photo-orienting polymer.

[8] The optical laminate according to any one of [1] to [7], wherein the protective layer contains at least one selected from the group consisting of a vinyl alcohol-based polymer, a (meth)acryl-based polymer, and a urethane-based polymer.

[9] The optical laminate according to any one of [1] to [8], further including an adhesive layer adjacent to the protective layer on a side of the protective layer opposite to the orientation layer.

[10] The optical laminate according to any one of [1] to [9], wherein a base material is not included on the side of the protective layer opposite to the orientation layer.

[11] The optical laminate according to any one of [1] to [10], further including a second protective layer on a side of the light absorption anisotropic layer opposite to the orientation layer.

[12] The optical laminate according to [11], wherein the visibility correction transmittance in the second region is 90% or more.

[13] The optical laminate according to any one of [1] to [12], further including a retardation layer having a ¼ wavelength plate function.

[14] A method of producing an optical laminate including a protective layer having a thickness of 5 μm or less, an orientation layer, and a light absorption anisotropic layer in this order, the method including the steps of:
  irradiating a laminate including, in this order, a base material, the protective layer having a thickness of 5 μm or less, the orientation layer, and the light absorption anisotropic layer, which is a layer including a liquid crystal composition containing a dichroic dye, with a laser having a wavelength of 300 nm to 800 nm to form a region having a lower content of the dichroic dye than other regions in the layer including the liquid crystal composition; and peeling off the base material after the step of irradiating with the laser.

[15] The production method according to [14], further including, after the step of irradiating with the laser, a step of forming a second protective layer on a surface on a side of the light absorption anisotropic layer opposite to the orientation layer.

[16] The production method according to [14] or [15], wherein a thickness (T1) of the protective layer that is 5 μm or less and a thickness (T2) of the base material satisfy the following formula (1):

$$T1/T2 \leq 0.3 \qquad (1).$$

[17] The production method according to any one of [14] to [16], wherein the base material has a thickness of 15 μm or more.

According to the present invention, it is possible to provide an optical laminate including an optically anisotropic layer having at least two regions having different visibility correction transmittances, in which the visibility correction transmittance in a region having a high transmittance is further improved.

DETAILED DESCRIPTION OF THE PREFERRED EMBODIMENT

Hereinafter, an embodiment of the present invention will be described in detail. The scope of the present invention is not limited to the embodiment described herein, and various modifications can be made without departing from the spirit of the present invention.

<Optical Laminate>

The optical laminate of the present invention has at least a first region and a second region having different values of visibility correction transmittance, and has a protective layer having a thickness of 5 μm or less, an orientation layer, and a light absorption anisotropic layer in this order. In the optical laminate of the present invention, the second region is a region in which the visibility correction transmittance is higher than that in the first region, and in an optically anisotropic layer, the light absorption anisotropic layer includes at least the first region and the second region having different values of visibility correction transmittance.

Figure 1A:
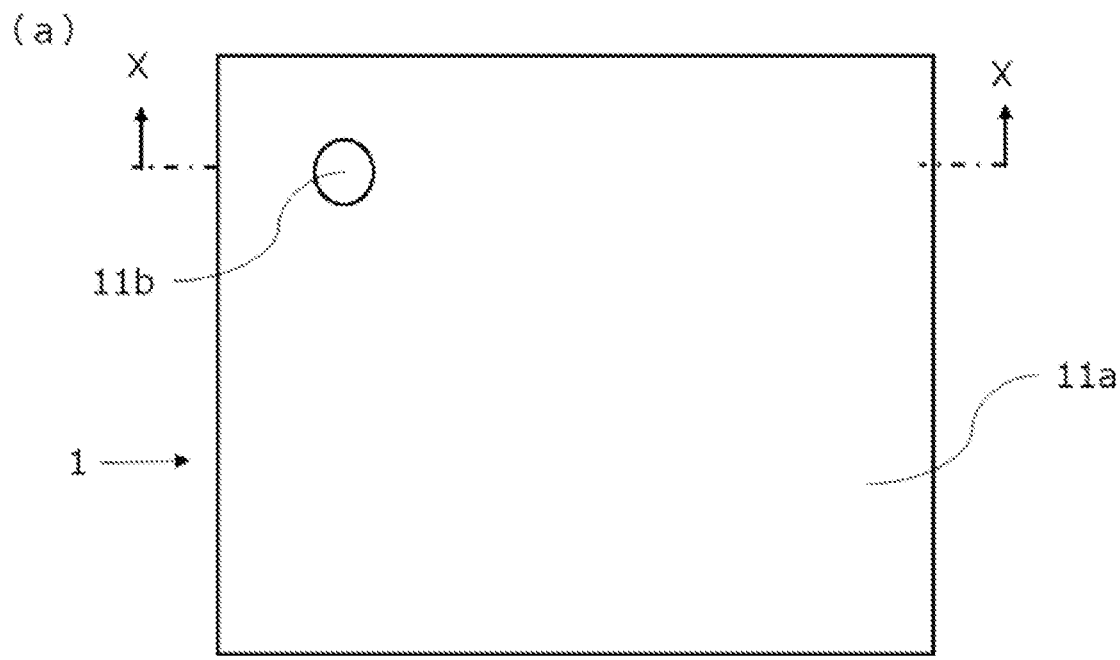
FIG. 1(a) is a schematic plan view showing an example of an optical laminate of the present invention.

Hereinafter, an example of a configuration of the optical laminate according to an aspect of the present invention will be described with reference to the drawings. FIG. 1(a) is a schematic plan view showing an example of the optical laminate of the present invention, and is a plan view of the optical laminate of the present invention as viewed from a light absorption anisotropic layer side. In the present embodiment shown in FIG. 1(a), an optical laminate 1 has a light absorption anisotropic layer 11. The light absorption anisotropic layer 11 includes at least two regions having different values of the visibility correction transmittance (Ty). In the optical laminate 1 shown in FIG. 1(a), the light absorption anisotropic layer 11 includes a first region 11a and a second region 11b having a higher visibility correction transmittance than the first region 11a.

Figure 1B:
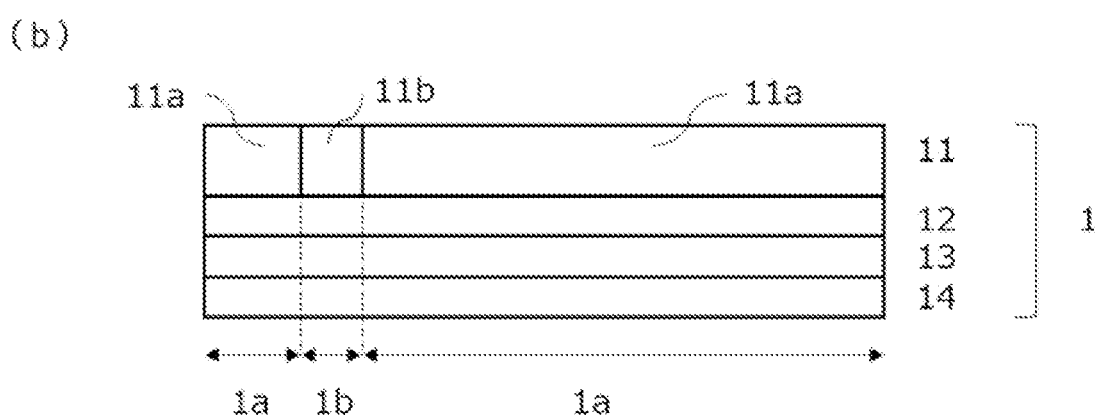
FIG. 1(b) is a cross-sectional view taken along line X-X of FIG. 1(a)
Figure 2:
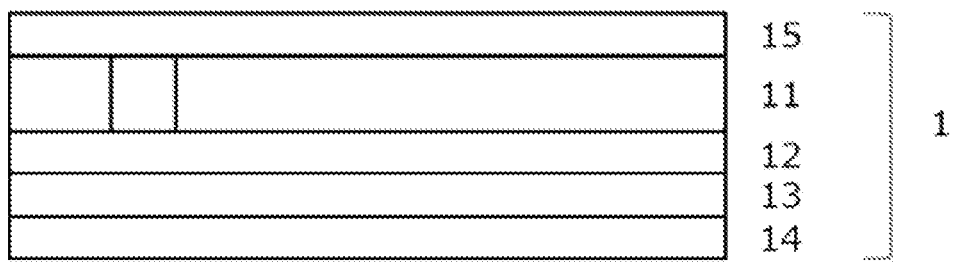
FIG. 2 is a schematic cross-sectional view showing an example of the optical laminate of the present invention.

FIG. 1(b) is a schematic cross-sectional view showing a cross section taken along line X-X of the optical laminate shown in FIG. 1(a). In the optical laminate 1 of the present invention shown in FIG. 1(b), the light absorption anisotropic layer 11 including the first region 11a and the second region 11b is stacked on a protective layer 13 having a thickness of 5 μm or less with an orientation layer 12 interposed therebetween. The optical laminate of the present invention may include other layers as long as it has the protective layer having a thickness of 5 μm or less, the orientation layer, and the light absorption anisotropic layer in this order; however, it is preferable that the protective layer 13 having a thickness of 5 μm or less, the orientation layer 12, and the light absorption anisotropic layer 11 are adjacent to each other in this order. Examples of other layers include an adhesive layer (14 in FIG. 1(b)) stacked on a surface of the protective layer having a thickness of 5 μm or less on a side opposite to the orientation layer, a second protective layer stacked on a surface of the light absorption anisotropic layer on the side opposite to the orientation layer, a retardation layer having a ¼ wavelength plate function, a retardation layer having a ½ wavelength plate function, and a layer having a positive C plate function.

The light absorption anisotropic layer constituting the optical laminate of the present invention includes at least the first region and the second region. In the specification of the present invention, when the optical laminate is viewed in a laminated cross section, the entire region (1a in FIG. 1(b)) stacked in the first region of the light absorption anisotropic layer is regarded as the first region of the optical laminate, and the entire region (1b in FIG. 1 b)) stacked in the second region of the light absorption anisotropic layer is regarded as the second region of the optical laminate. The first region of the optical laminate of the present invention has a layer configuration including the protective layer having a thickness of 5 μm or less, the orientation layer, and the light absorption anisotropic layer in this order. On the other hand, as will be described later, in the second region of the optical laminate, the light absorption anisotropic layer or the protective layer itself may be removed by laser irradiation for forming the second region in the light absorption anisotropic layer, and the second region may not necessarily have the layer configuration including the protective layer having a thickness of 5 μm or less, the orientation layer, and the light absorption anisotropic layer in this order; however, in one aspect of the present invention, it is preferable that both the first region and the second region of the optical laminate have the layer configuration including the protective layer having a thickness of 5 μm or less, the orientation layer, and the light absorption anisotropic layer in this order.

In the present invention, the light absorption anisotropic layer is a layer including a liquid crystal composition containing a dichroic dye, and the formation (pattern formation) of the second region having a higher visibility correction transmittance than that of the peripheral region is formed by irradiating a region where the second region is to be provided with a laser having a specific wavelength as described later. For example, in the pattern formation by removal of an unpolymerized polymerizable liquid crystal compound with a solvent, the solvent may come into contact with a polymer at the time of washing with the solvent, thereby causing disturbance of liquid crystal orientation, and as a result, it is likely to lead to a decrease in polarization degree. Since the pattern formation by laser irradiation does not require such a washing step with a solvent, a light absorption anisotropic layer having a higher polarization degree in the first region can be obtained. It is also advantageous in that it is possible to accurately form a pattern including smaller and/or finer regions. The pattern formation by laser irradiation is usually performed by irradiating a layer including the liquid crystal composition formed on a base material layer with the orientation layer interposed therebetween with a laser having a specific wavelength, and by laser irradiation, the dichroic dye existing in an irradiated region is decomposed, or the light absorption anisotropic layer itself is removed and decolored, so that a second region having a higher visibility correction transmittance than that of a non-irradiated region is formed. In the laser irradiated region of the light absorption anisotropic layer, the dichroic dye is decomposed, or the light absorption anisotropic layer itself is removed and decolored; therefore, it has been conventionally considered that a region having a sufficiently high visibility correction transmittance can be formed by laser irradiation. However, according to the research of the present inventors, it has been found that when the pattern formation by laser irradiation is performed in the optical laminate in which the base material layer, the orientation layer, and the light absorption anisotropic layer are stacked in this order, although the dichroic dye in the light absorption anisotropic layer is decomposed and decolorized, deposition of the dichroic dye occurs in the base material layer located below the light absorption anisotropic layer in the laser irradiated region, and as a result, the visibility correction transmittance in the laser irradiated region as the optical laminate having such a configuration may not be sufficiently increased in some cases.

In the optical laminate of the present invention, by forming the protective layer (hereinafter, sometimes referred to as a "first protective layer") having a thickness of 5 µm or less as an essential component, the visibility correction transmittance can be further improved in the second region formed by laser irradiation. Although the reason for this is not limited, the following is conceivable. As described later, in a process of producing the optical laminate of the present invention, when laser irradiation for forming the second region is performed, usually, a peelable base material layer is preferably present adjacently on a side of the first protective layer opposite to the orientation layer, and the base material layer is peeled off after the laser irradiation, whereby the optical laminate of the present invention is obtained. The dichroic dye is decomposed and decolorized in the second region of the light absorption anisotropic layer by laser irradiation. At this time, the first protective layer having a film thickness of 5 µm or less does not hinder discharge of the decomposed dichroic dye to the outside of the light absorption anisotropic layer. On the other hand, due to the presence of the first protective layer having a film thickness of 5 µm or less, pigmentation associated with decomposition/decolorization of the dichroic dye by laser irradiation can be limited to occur in the base material layer. In addition, the first protective layer functions as a layer that promotes peeling of the base material later, so that deposition of the dichroic dye can be easily removed together with the base material layer. As a result, as the optical laminate incorporated in a display device or the like, sufficiently high visibility correction transmittance (hereinafter, also referred to as "Ty2") in the second region formed by laser irradiation can be secured.

In the present invention, the thickness of the first protective layer is 5 µm or less. When the thickness of the first protective layer exceeds 5 µm, pigmentation is likely to occur in the first protective layer when the second region is formed by laser irradiation, and it becomes difficult to sufficiently increase the visibility correction transmittance of the second region to be obtained. The thickness of the first protective layer is preferably 4 µm or less, more preferably 3 µm or less from the viewpoint of suppressing pigmentation in the protective layer without hindering discharge of the dichroic dye, decomposed in the second region of the light absorption anisotropic layer, to the outside of the light absorption anisotropic layer. On the other hand, it is preferable that the first protective layer also functions to protect the light absorption anisotropic layer stacked with the thin orientation layer interposed therebetween. When the base material layer is present on the side of the first protective layer opposite to the orientation layer during formation of the light absorption anisotropic layer, the first protective layer is also required to function as a layer that promotes peeling of the base material layer later. In order to sufficiently exhibit such a function, the thickness of the first protective layer is preferably 0.05 µm or more, and more preferably 0.1 µm or more.

The optical laminate of the present invention has the light absorption anisotropic layer on the first protective layer with the orientation layer interposed therebetween.

In the present invention, the light absorption anisotropic layer included in the optical laminate is the layer including the liquid crystal composition containing the dichroic dye, and substantially means a polarizing layer. The first region in the light absorption anisotropic layer is preferably a region having a polarizing function required for a polarizing layer constituting a conventional general polarizing film, and usually has substantially uniform visibility correction transmittance. The higher the visibility correction transmittance (hereinafter, also referred to as "Ty1") is, the more clarity at the time of white display is; however, as can be seen from the relationship between (Formula 1) and (Formula 2) described later, there is a problem that the polarization degree decreases when a single transmittance is excessively increased. Thus, the visibility correction transmittance is preferably 35% or more, more preferably 38% or more, and still more preferably 40% or more, and is preferably 55% or less, more preferably 50% or less, and still more preferably 45% or less. When the visibility correction single transmittance Ty is excessively high, a visibility correction polarization degree Py becomes too low, and an antireflection function when used as an antireflection film may be insufficient.

The first region is preferably a region having high polarization characteristics. From such a viewpoint, the visibility correction polarization degree (hereinafter, also referred to as "Py1") is 80% or more, preferably 92% or more, more preferably 97% or more, and still more preferably 98% or more. If the visibility correction polarization degree Py1 is too low, the antireflection function when used as the antireflection film may not be achieved. The upper limit of the visibility correction polarization degree of the first region is not particularly limited, and is usually 100% or less. The visibility correction transmittance and the visibility correction polarization degree in the first region can be controlled by, for example, the types of the dichroic dye and the liquid crystal compound constituting the first region, the blending ratio thereof, and the thickness of the light absorption anisotropic layer.

In the present invention, the second region of the light absorption anisotropic layer is a region in which the visibility correction transmittance is higher than the visibility correction transmittance of the first region. The second region usually has substantially uniform visibility correction transmittance. The optical laminate of the present invention has a configuration in which the light absorption anisotropic layer is stacked on the first protective layer having a thickness of 5 μm or less with the orientation layer interposed therebetween, and can achieve high visibility correction transmittance in the region even when pattern formation by laser irradiation is performed. Thus, the visibility correction transmittance Ty2 of the second region is preferably 87% or more, more preferably 88% or more, still more preferably 89% or more, and particularly preferably 90% or more. The higher the visibility correction transmittance of the second region is, the higher transparency is, which is advantageous in the problem of the present invention; however, the visibility correction transmittance of the second region is usually 98% or less in consideration of an interface reflection loss or the like associated with a refractive index difference at an interface between the light absorption anisotropic layer and an adjacent layer.

The second region is preferably a low polarization region having the visibility correction polarization degree (hereinafter, also referred to as "Py2") lower than the visibility correction polarization degree Py1 of the first region. The visibility correction polarization degree Py2 in the second region may be, for example, 10% or less, preferably 5% or less, more preferably 1% or less, or may also be 0%.

The visibility correction transmittance and the visibility correction polarization degree of the first region and the second region can be controlled by the composition and configuration of the light absorption anisotropic layer, the condition of laser irradiation when forming the second region, the timing of laser irradiation (the order of laser irradiation and protective layer formation), the layer configuration of the optical laminate, and the like.

In the present invention, the visibility correction transmittance and the visibility correction polarization degree in the first region and the second region of the optical laminate are usually determined by the visibility correction transmittance and the visibility correction polarization degree in the first region and the second region of the light absorption anisotropic layer. Therefore, a suitable range of the visibility correction transmittance and the visibility correction polarization degree in the first region and the second region of the optical laminate in the present invention is a range similar to the visibility correction transmittance and the visibility correction polarization degree in the first region and the second region of the light absorption anisotropic layer described above.

In general, as the visibility correction transmittance of the second region is closer to 100% with respect to the first region required to have high polarization characteristics, the transparency is higher, and for example, it can be said that it is suitable for application to a display and the like using the second region as a camera hole. Thus, in one aspect of the present invention, a difference between the visibility correction transmittance of the first region and the visibility correction transmittance of the second region is preferably 45% or more, more preferably 47% or more, still more preferably 48% or more, particularly preferably 49% or more, and is usually 60% or less.

In the present invention, the visibility correction transmittance (Ty) and the visibility correction polarization degree (Py) can be calculated based on the single transmittance and the polarization degree measured using a spectrophotometer. For example, a transmittance ($T_1$) in a transmission axis direction (vertical direction of orientation) and a transmittance ($T_2$) in an absorption axis direction (same direction of orientation) in a visible wavelength range of 380 nm to 780 nm, can be measured by a double beam method using a device in which a folder with a polarizer is set in a spectrophotometer. In the present specification, the visibility correction transmittance and the visibility correction polarization degree are measured in the layer configuration of the optical laminate to be measured. That is, for example, when the visibility correction transmittance of the second region in the light absorption anisotropic layer is measured in the optical laminate including the first protective layer, the orientation layer, and the light absorption anisotropic layer, the visibility correction transmittance of the second region of the light absorption anisotropic layer is measured in the layer configuration including the first protective layer and the orientation layer. A measurement diameter is a circular diameter of 10 mm. With regard to the single transmittance and the polarization degree in the visible light range, the single transmittance and the polarization degree at each wavelength are calculated using the following formulas (Formula 1) and (Formula 2), and in addition, the visibility is corrected by a 2-degree visual field (C light source) of JIS Z 8701, whereby the visibility correction transmittance (Ty) and the visibility correction polarization degree (Py) can be calculated. Specifically, the visibility correction transmittance (Ty) and the visibility correction polarization degree (Py) can be measured and calculated according to the method described in Examples described later.

Single transmittance [%]=$(T_1+T_2)/2$ (Formula 1)

Polarization degree [%]=$\{(T_1-T_2)/(T_1+T_2)\}\times100$ (Formula 2)

In the light absorption anisotropic layer, one first region and one second region may exist, or a plurality of the first regions and a plurality of the second regions may exist. There may be a third region other than the first region and the second region, which has the visibility correction transmittance different from those of the first region and the second region. An occupied area of the first region and an occupied area of the second region with respect to a surface area of the light absorption anisotropic layer may be appropriately determined according to characteristics required for the light absorption anisotropic layer and the optical laminate including the light absorption anisotropic layer. In one aspect of the present invention, a ratio of the total occupied area of the first region and the second region to the surface area of the light absorption anisotropic layer is preferably 90% or more, more preferably 95% or more, and still more preferably 98% or more.

The occupied area of the first region may be, for example, 50% or more, more preferably 70% or more, and still more preferably 80% or more with respect to the total area of the occupied area of the first region and the occupied area of the second region. The occupied area of the second region with respect to the total area of the occupied area of the first region and the occupied area of the second region is preferably 50% or less, more preferably 30% or less, and still more preferably 20% or less.

For example, as shown in FIG. 1(a), the occupied area of the second region 11b may be smaller than the occupied area of the first region 11a, and the first region 11a may be provided so as to surround the second region 11b. In the light absorption anisotropic layer 11 shown in FIG. 1(a), the first region 11a is provided so as to surround one circular second region 11b; however, a plurality of the second regions 11b may be provided independently.

In the optical laminate of the present invention, the shape of the first region is not particularly limited, and examples of the shape in plan view include a circular shape, an elliptical shape, an oval shape, a polygonal shape, a linear shape, a band-like shape, and a wavy shape.

In the optical laminate of the present invention, the shape of the second region may be appropriately determined according to the use of the light absorption anisotropic layer and the optical laminate including the light absorption anisotropic layer, the shape of the first region, a distribution of the second region in the first region, and the like. The planar view shape of the second region may be, for example, any shape such as a circular shape; an elliptical shape; an oval shape; a polygonal shape such as triangle, square, rectangle, or rhombus; a character shape; or a combination of these shapes. From the viewpoint of ease of processing when the second region is formed, the second region is preferably circular, elliptical, oval, or polygonal.

When the second region has a circular shape, the diameter thereof is preferably 2 cm or less, more preferably 1.5 cm or less, still more preferably 1 cm or less, and usually 0.05 cm or more. When the second region has an elliptical shape or an oval shape, the major diameter thereof is preferably 2 cm or less, more preferably 1.5 cm or less, still more preferably 1 cm or less, and usually 0.05 cm or more. When the second region has a polygonal shape, a diameter of a virtual circle drawn such that the polygon is inscribed is preferably 2 cm or less, more preferably 1.5 cm or less, still more preferably 1 cm or less, and usually 0.05 cm or more.

The second region having a circular shape, an elliptical shape, an oval shape, a polygonal shape, or another shape is suitable as a region corresponding to a lens position of a camera provided in a smartphone, a tablet, or the like. At this time, when the visibility correction transmittance Ty2 of the second region is 87% or more, coloring of the second region is reduced, and high transparency is obtained, which can contribute to improvement of camera performance.

When the optical laminate is a long laminated film, the long laminated film is usually cut into a predetermined size according to the use of the optical laminate and the like, and therefore, it is preferable to set the arrangement of the first region and the second region in the long laminated film so that the first region and the second region are formed at a predetermined position of the optical laminate after cutting. For example, when the optical laminate after cutting includes the light absorption anisotropic layer shown in FIG. 1(a), the plurality of second regions 11b may be provided at predetermined intervals in the length direction and/or the width direction of the light absorption anisotropic layer in the long laminated film.

The thickness of the first region in the light absorption anisotropic layer may be appropriately determined according to the use of the optical laminate, the shape of the first region, the distribution of the first region and the second region, and the like. In one aspect of the present invention, the thickness of the first region is 0.1 μm or more and 5 μm or less, more preferably 0.3 μm or more and 4 μm or less, and still more preferably 0.5 μm or more and 3 μm or less. When the thickness is within this range, necessary light absorption is easily obtained, and orientation defects tend not to occur without affecting an orientation regulating force by the orientation film.

The thickness of the first region of the light absorption anisotropic layer which is a layer including a liquid crystal composition can be measured by, for example, an interference film thickness meter, a laser microscope, a stylus-type thickness-meter, or the like. Hereinafter, the same applies to the thickness of the second region and the thicknesses of the layers constituting the optically anisotropic layer.

The thickness of the second region in the light absorption anisotropic layer may be appropriately determined according to the use of the optical laminate, the shape of the second region, the distribution of the first region and the second region, and the like, and is preferably the same thickness as the first region. Therefore, in one aspect of the present invention, the thickness of the second region is 0.1 μm or more and 5 μm or less, more preferably 0.3 μm or more and 4 μm or less, and still more preferably 0.5 μm or more and 3 μm or less. By setting the thicknesses of the first region and the second region to be about the same and reducing a step between the first region and the second region, when another layer such as a ¼ wavelength plate (retardation layer) or the second protective layer to be described later is stacked on the light absorption anisotropic layer, it is easy to suppress defects such as engagement of bubbles and generation of wrinkles.

When the thickness of the first region is different from the thickness of the second region, the difference between the thicknesses is preferably 2 μm or less, more preferably 1 μm or less, and still more preferably 0.5 μm or less. In the optical laminate of the present invention in which the layer including the liquid crystal composition to be the light absorption anisotropic layer is formed and then the second region is formed by laser irradiation, when the thickness of the first region is different from the thickness of the second region, the thickness of the second region is usually smaller than the thickness of the first region. In particular, when the difference in thickness between the first region and the second region as the optical laminate is within the above range, the effect of suppressing defects such as engagement of bubbles and generation of wrinkles is excellent.

In order to realize high visibility correction transmittance in the second region formed by laser irradiation, the optical laminate of the present invention usually does not include a base material layer on the side of the first protective layer opposite to the orientation layer.

The base material layer used herein means a layer that functions as a base material that supports the light absorption anisotropic layer and the orientation layer when the optical laminate is formed, and includes, for example, a resin base material layer, a glass base material layer, and the like that are generally used as the base material in the art. For example, the production of a polarizing layer, which is a layer including a liquid crystal composition, usually includes a series of steps of applying a liquid composition (solution) containing a solvent together with the liquid crystal compound on a base material and curing the liquid crystal compound in an oriented state. The base material layer used in such a step is generally required to have a certain degree or more of strength and rigidity so as to stably support an applied layer of the liquid crystal composition and a layer to be formed, and a certain degree of thickness is required in order to secure desired strength and rigidity. On the other hand, as the thickness increases so as to be able to function as the base material layer, pigmentation of the dichroic dye tends to easily occur when the second region is formed by laser irradiation, and such a base material layer may cause a decrease in visibility correction transmittance in the second region. Therefore, the optical laminate of the present invention does not include a substrate layer of preferably 15 μm or more, more preferably 10 μm or more, particularly preferably more than 5 μm on the side of the first protective layer opposite to the orientation layer.

In one aspect of the present invention, the optical laminate of the present invention may further include an adhesive layer adjacent to the first protective layer on the side of the first protective layer opposite to the orientation layer. It is possible to stack another optical film such as a retardation layer, an organic EL element, and the like with such an adhesive layer interposed therebetween.

In one aspect of the present invention, a second protective layer may be provided on the side of the light absorption anisotropic layer opposite to the orientation layer. The second protective layer can protect the surface of the light absorption anisotropic layer, effectively suppress diffusion of the dichroic dye contained in the light absorption anisotropic layer to other layers, and improve heat resistance of the optical laminate. From the viewpoint of sufficiently obtaining such an effect, the second protective layer is preferably provided adjacent to the light absorption anisotropic layer on the side of the light absorption anisotropic layer opposite to the orientation layer.

When the second protective layer is provided, the visibility correction transmittance Ty2 in the second region of the light absorption anisotropic layer is preferably 90% or more, more preferably 91% or more, and still more preferably 92% or more. When the second protective layer is provided on the optical laminate, the visibility correction transmittance in the second region can be increased by stacking the second protective layer after forming the second region by laser irradiation.

The thickness of the second protective layer is not particularly limited, and is preferably 0.05 μm or more, more preferably 0.1 μm or more, and preferably 5 μm or less, more preferably 3 μm or less because it becomes easy to realize a reduction in thickness of the optical laminate while playing a role as a protective layer for the light absorption anisotropic layer. The thickness of the first protective layer and the thickness of the second protective layer may be the same or different. In one aspect of the present invention, the second protective layer is thinner than the first protective layer.

From the viewpoint of suppressing pigmentation on each layer constituting the optical laminate and realizing high visibility correction transmittance of the second region at the time of preparing the second region by laser irradiation, it is preferable that a layer having a thickness of more than 5 μm is not included between the first protective layer and the light absorption anisotropic layer, or between the first protective layer and the second protective layer in a case where the second protective layer is included, and it is more preferable that a layer having a thickness of 3 μm or more, or 2 μm or more is not included.

Hereinafter, each layer included in the optical laminate of the present invention will be described with an example of components, materials, and the like that can constitute the layers.

(First Protective Layer)

When the second region is formed by irradiating a layer formed from a liquid crystal composition to be a light absorption anisotropic layer with a laser, the first protective layer is required to have a configuration that does not hinder discharge of a dichroic dye decomposed by laser irradiation to the outside of the light absorption anisotropic layer and does not cause pigmentation on the protective layer itself. The first protective layer can be formed to have a thickness of 0.1 μm or more and 10 μm or less, more preferably 0.1 μm or more and 5 μm or less, still more preferably 0.1 μm or more and 3 μm or less, and can be formed from a material known in the art as long as the first protective layer can perform the function. In the present invention, the first protective layer is usually configured to include a polymer component, and examples thereof include a layer formed from a composition containing a water-soluble polymer, and a cured resin layer formed from a composition containing an active energy ray-curable or thermosetting curable component. Among them, a cured resin layer formed from a composition containing the active energy ray-curable component is preferable.

In the present invention, the polymer component is preferably a polymer having a high crosslinking density or a water-soluble polymer having a high hydrophilic interaction. Examples thereof include (meth)acrylic polymers, epoxy-based polymers, oxetane-based polymers, urethane-based polymers, melamine-based polymers, and vinyl alcohol-based polymers. These polymer components may be used singly or in combination of two or more kinds thereof. Among these polymer components, from the viewpoint of high curability and easy formation, it is preferable to contain at least one selected from the group consisting of a (meth)acrylic polymer, an epoxy-based polymer, an oxetane-based polymer, a urethane-based polymer, and a melamine-based polymer, and it is more preferable to contain at least one selected from the group consisting of a (meth)acrylic polymer and a urethane-based polymer. From the viewpoint of hydrophilicity, a vinyl alcohol-based polymer is preferable. In the present specification, the urethane-based polymer means a polymer having a urethane structure (bond), and for example, even when the polymer has a (meth)acryloyl group in addition to the urethane structure, the polymer is classified as the urethane-based polymer in the present invention.

Examples of the vinyl alcohol-based polymer include (modified) polyvinyl alcohol, an ethylene-vinyl alcohol copolymer, and (meth)acrylic acid or an anhydride-vinyl alcohol copolymer thereof.

Examples of the (meth)acrylic polymer include monofunctional (meth)acrylates such as methyl (meth)acrylate, ethyl (meth)acrylate, isopropyl (meth)acrylate, butyl (meth)acrylate, isobutyl (meth)acrylate, t-butyl (meth)acrylate, 2-ethylhexyl (meth)acrylate, 2-hydroxyethyl (meth)acrylate, 2-hydroxypropyl (meth)acrylate, hydroxybutyl (meth)acrylate, and 2-hydroxy-3-phenoxypropyl (meth)acrylate; and polyfunctional (meth)acrylates such as polymers or copolymers containing, as monomers, one or two or more types of ethylene glycol di(meth)acrylate, diethylene glycol di(meth)acrylate, triethylene glycol di(meth)acrylate, tetradecaethylene glycol di(meth)acrylate, dipropylene glycol di(meth)acrylate, 1,3-butylene glycol di(meth)acrylate, trimethylolpropane tri(meth)acrylate, tetramethylolmethane tetra (meth)acrylate, 1,4-butanediol di(meth)acrylate, 1,6-hexanediol di(meth)acrylate, pentaerythritol tri(meth)acrylate, pentaerythritol tetra(meth)acrylate, dipentaerythritol hexa(meth)acrylate, and the like.

Examples of the urethane-based polymer include polyurethanes such as ether-based polyurethane, ester-based polyurethane, and carbonate-based polyurethane, urethane (meth)acrylate, and an acryl-urethane copolymer obtained by copolymerizing alkyl (meth)acrylate.

The content of the polymer component in the first protective layer can be appropriately determined according to the type of the polymer component to be used and the like, and is preferably 50% by mass or more, more preferably 60% by mass or more, still more preferably 70% by mass or more, and particularly preferably 80% by mass or more, is usually 100% by mass or less, and may be, for example, 98% by mass or less, with respect to 100 parts by mass of a solid content of the protective layer. The protective layer containing a polymer component in an amount within the above range can be formed, for example, of a composition containing a curable component (monomer component) for forming the polymer in an amount of preferably 50% by mass or more, more preferably 60% by mass or more, still more preferably 70% by mass or more, particularly preferably 80% by mass or more, and preferably 100% by mass or less, more preferably 98% by mass or less based on the solid content of the composition in the composition for forming the protective layer. The "solid content" used herein refers to a component obtained by removing volatile components such as a solvent from the composition for forming the protective layer, and hereinafter, the "solid content" herein similarly refers to a component obtained by removing the volatile components such as a solvent from a target composition or the like.

In one aspect of the present invention, the first protective layer is preferably formed of a composition containing a urethane (meth)acrylate and a polyfunctional (meth)acrylate. In the optical laminate having the first protective layer formed containing the component, the visibility correction transmittance of the second region formed by laser irradiation is easily improved.

Urethane (meth)acrylate generally means a reaction product of an isocyanate compound, a polyol compound, and a (meth)acrylate compound. The urethane (meth)acrylate is preferably a polyfunctional urethane (meth)acrylate having two or more (meth)acryloyl groups in the molecule, and more preferably a polyfunctional urethane acrylate. Since the polyfunctional urethane (meth)acrylate can form a crosslinked structure, the polyfunctional urethane (meth)acrylate is advantageous from the viewpoint of improving the function as a protective layer, and can impart moderate toughness. The number of functional groups of the polyfunctional urethane (meth)acrylate is preferably 2 to 5.

Examples of the polyfunctional (meth)acrylate include the compounds exemplified above as monomers capable of constituting the (meth)acrylic polymer. The crosslinking density of the protective layer can be adjusted by controlling the molecular weight between crosslinking points and the number of crosslinking points of the polyfunctional (meth) acrylate. In general, the smaller the molecular weight between crosslinking points, the higher the crosslinking density, and the larger the number of crosslinking points, the higher the crosslinking density.

In one aspect of the present invention, the number of (meth)acryloyl groups of the polyfunctional (meth)acrylate is preferably 4 or more, more preferably 6 or more, and preferably 10 or less, more preferably 8 or less. When the number of (meth)acryloyl groups of the polyfunctional (meth)acrylate is the above lower limit or more, the polyfunctional (meth)acrylate can have strength against laser irradiation. As a result, when the second region is formed, damage to the first protective layer due to laser irradiation is prevented, and the thickness of the first protective layer is easily maintained, so that a laminated structure having no difference in thickness between the first region and the second region as the optical laminate can be obtained, and therefore, a laminate having an excellent effect of suppressing defects such as generation of bubbles and generation of wrinkles at the time of transfer can be obtained.

When the first protective layer is formed of the composition containing the urethane (meth)acrylate and the polyfunctional (meth)acrylate, a blending ratio of the urethane (meth)acrylate and the polyfunctional (meth)acrylate (urethane (meth)acrylate:polyfunctional (meth)acrylate, mass ratio) is preferably 20:80 to 80:20.

The first protective layer is formed of a composition (hereinafter, also referred to as a "composition for protective layer formation") containing a curable component as described above (such as a polymer component or a monomer component capable of forming the polymer component). The composition for protective layer formation may contain, in addition to the curable component, other components capable of forming a cured resin layer.

For example, the composition for protective layer formation containing an active energy ray-curable component (the composition is hereinafter also referred to as a "curable composition for protective layer formation") preferably contains a polymerization initiator from the viewpoint of improving curability. Although the polymerization initiator may be appropriately selected from known polymerization initiators so that curing of the curable component (monomer) contained in the curable composition for protective layer formation can be started, the photopolymerization initiator is preferably used from the viewpoint of easily improving productivity. Examples of the photopolymerization initiator include acetophenone-based initiators such as acetophenone, 3-methylacetophenone, benzyldimethylketal, 1-(4-isopropylphenyl)-2-hydroxy-2-methylpropane-1-one, 2-methyl-1-[4-(methylthio)phenyl]-2-morpholinopropane-1-one, (2-[4-(methylthio)benzoyl]-2-(4-morpholinyl)propane), and 2-hydroxy-2-methyl-1-phenylpropane-1-one; benzophenone-based initiators such as benzophenone, 4-chlorobenzophenone, and 4,4'-diaminobenzophenone; alkylphenone-based initiators such as 2,2-dimethoxy-1,2-diphenylethane-1-one, and 1-hydroxy-cyclohexyl-phenyl-ketone; benzoin ether-based initiators such as benzoin propyl ether and benzoin ethyl ether; thioxanthone-based initiators such as 4-isopropylthioxanthone; and acylphosphine oxide-based initiators such as bis(2,4,6-trimethylbenzoyl)-phenylphosphine oxide, and in addition, xanthone, fluorenone, camphorquinone, benzaldehyde, and anthraquinone are exemplified. These polymerization initiators may be used alone, or two or more kinds of them may be used in combination.

When the curable composition for protective layer formation contains a polymerization initiator, the amount of the polymerization initiator is preferably 1 part by mass or more, more preferably 2 parts by mass or more, and preferably 10 parts by mass or less, more preferably 8 parts by mass or less, with respect to 100 parts by mass of the solid content of the composition. When the content of the polymerization initiator is within the above range, sufficient curability can be obtained without affecting the optical performance of the optical laminate.

The curable composition for protective layer formation may contain additives other than the polymerization initiator, for example, an ultraviolet absorber, an antistatic agent, a stabilizer, an antioxidant, a colorant, a surface conditioner, and the like, as necessary. The other additives may be used alone, or two or more kinds of them may be used in combination. When other additives are contained, the content thereof is preferably about 0.1 to 20% by mass with respect to the total mass of the solid content of the curable composition for protective layer formation.

In order to improve coatability, viscosity adjustment may be performed by adding a solvent to the curable composition for protective layer formation. The solvent may be any solvent as long as it can dissolve various components constituting the curable composition for protective layer formation, and examples of the solvent include water; alcohol solvents such as methanol, ethanol, ethylene glycol, isopropyl alcohol, propylene glycol, methyl cellosolve, butyl cellosolve, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, methyl amyl ketone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; and chlorinated hydrocarbon solvents such as chloroform and chlorobenzene. These solvents can be used alone or in combination of two or more.

The type and content of the solvent are appropriately selected according to the type and content of the component contained in the curable composition for protective layer formation, the coating method, the desired thickness of the protective layer, and the like. For example, the content of the solvent is preferably 3 parts by mass or more, more preferably 5 parts by mass or more, and still more preferably 7 parts by mass or more, and is preferably 1000 parts by mass or less, more preferably 100 parts by mass or less, and still more preferably 50 parts by mass or less, with respect to 100 parts by mass of the solid content of the curable composition for protective layer formation.

When the composition for protective layer formation is a composition containing a water-soluble polymer (the composition is hereinafter also referred to as a "water-soluble polymer composition"), the content of the water-soluble polymer in the composition is preferably 75% by mass or more, more preferably 80% by mass or more, and still more preferably 85% by mass or more.

When the first protective layer is a layer formed of the water-soluble polymer composition, a crosslinked structure may be introduced by using a crosslinking agent in order to enhance denseness of the layer and improve the function as a protective layer. As such a crosslinking agent, for example, in addition to an ion-bonding crosslinking agent such as glyoxylic acid salt, a water-soluble additive such as an epoxy-based crosslinking agent, and a crosslinking agent, a hydrophobic crosslinking agent such as an isocyanate-based crosslinking agent, a polyvalent aldehyde-based crosslinking agent such as glyoxal or a glyoxal derivative, or a metal compound-based crosslinking agent such as zirconium chloride or titanium lactate may be used for the purpose of imparting water resistance.

When the crosslinking agent is used to introduce the crosslinked structure, the amount of the crosslinking agent to be added may be appropriately determined according to the type of the crosslinking agent to be used and the like. For example, the content may be 0.1 to 100 parts by mass, preferably 1 to 70 parts by mass, and more preferably 10 to 60 parts by mass, with respect to 100 parts by mass of the water-soluble polymer. When the content of the crosslinking agent is within the above range, the resulting cured resin layer becomes dense, and the function as a protective layer for the light absorption anisotropic layer is easily improved.

The water-soluble polymer composition is usually prepared as a solution in which a water-soluble polymer is dissolved in a solvent. The solvent may be appropriately selected according to the water-soluble polymer to be used, and typically includes water, alcohol, a mixture of water and alcohol, and the like, and water is preferable.

A solid content concentration of the water-soluble polymer composition obtained by adding a solvent to a component constituting the cured resin layer such as a water-soluble polymer or a crosslinking agent is preferably 1 to 50% by mass, and more preferably 2 to 30% by mass. When the solid content concentration of the water-soluble polymer composition is within the above range, the viscosity of the composition is lowered, so that the coatability and handleability are improved.

The water-soluble polymer composition may contain other components such as additives in addition to a solvent such as a water-soluble polymer, a crosslinking agent, or water. Examples of such other components include a preservative and a leveling agent. When the water-soluble polymer composition contains other components such as additives, the amount thereof is preferably 10% by mass or less, and more preferably 5% by mass or less, based on the solid content of the composition.

The first protective layer is obtained, for example, by applying the composition for protective layer formation onto a substrate that can be peeled off later as described later, and curing the composition. Examples of the method for applying the composition for protective layer formation include known methods such as: coating methods including a spin coating method, extrusion method, gravure coating method, die coating method, bar coating method, and applicator method; and printing methods including a flexographic method.

The method for curing the composition for protective layer formation may be appropriately determined according to the composition of the composition. For example, when the composition for protective layer formation is an active energy ray-curable composition, the curable component contained in the composition can be cured by irradiation with an active energy ray to obtain a protective layer. Examples of the active energy ray include visible light, ultraviolet light, infrared light, X-ray, $\alpha$-ray, $\beta$-ray, and $\gamma$-ray. Among these active energy rays, ultraviolet light is preferable because it is easy to control the progress of the reaction and photopolymerization apparatuses widely used in this field can be used.

Examples of light sources of the active energy rays include a low pressure mercury lamp, a medium pressure mercury lamp, a high pressure mercury lamp, an ultrahigh pressure mercury lamp, a xenon lamp, a halogen lamp, a carbon arc lamp, a tungsten lamp, a gallium lamp, an excimer laser, an LED light source emitting light in a wavelength range of 380 nm to 440 nm, a chemical lamp, a black light lamp, a microwave-excited mercury lamp, and a metal halide lamp.

An ultraviolet irradiation intensity is usually 10 to 3,000 mW/cm$^2$. It is preferable that the ultraviolet irradiation intensity is an intensity within a wavelength region effective for activating the polymerization initiator. A period for irradiating the light is usually 0.1 seconds to 10 minutes, preferably 1 seconds to 5 minutes, more preferably 5 seconds to 3 minutes, and still more preferably 10 seconds to 1 minute. When ultraviolet rays are irradiated once or multiple times with such an ultraviolet irradiation intensity, the integrated amount of the light is 10 to 3,000 mJ/cm$^2$, preferably 50 to 2,000 mJ/cm$^2$, and more preferably 100 to 1,000 mJ/cm$^2$.

When the composition for protective layer formation is a water-soluble polymer composition, for example, the first protective layer which is a cured resin layer can be obtained by drying and curing a coating film obtained by applying the water-soluble polymer composition.

The drying temperature, time, and the like for forming the cured resin layer from a coating film of the water-soluble polymer composition are not particularly limited, and may be appropriately determined according to the composition and the like of a water-soluble polymer-containing composition to be used. The drying treatment can be performed, for example, by blowing hot air, and the temperature thereof is usually in a range of 40 to 100° C., preferably 60 to 100° C. The drying time is usually 10 to 600 seconds.

(Light Absorption Anisotropic Layer)

In the present invention, the light absorption anisotropic layer is the layer including the liquid crystal composition containing the dichroic dye, and examples thereof include a layer obtained by applying a composition containing a dichroic dye having liquid crystallinity or a polymerizable liquid crystal composition containing a dichroic dye and a polymerizable liquid crystal compound. The optical laminate using a layer, formed from such a liquid crystalline composition, as the light absorption anisotropic layer (polarizing layer) can be suitably used for, for example, flexible display applications in that a hue can be arbitrarily controlled, that the optical laminate can be significantly thinned, and that the optical laminate has non-shrinkability because there is no stretching relaxation by heat.

The dichroic dye refers to a dye having a property that an absorbance in a major axis direction of the molecule is different from an absorbance in a minor axis direction. The dichroic dye preferably has a property of absorbing visible light, and more preferably has an absorption maximum wavelength (λMAX) in a range of 380 to 680 nm. Examples of such a dichroic dye include an acridine dye, an oxazine dye, a cyanine dye, a naphthalene dye, an azo dye, and an anthraquinone dye, and among them, an azo dye is preferable. Examples of the azo dye include a monoazo dye, a bisazo dye, a trisazo dye, a tetrakisazo dye, and a stilbeneazo dye, preferably a bisazo dye and a trisazo dye. The dichroic dyes may be used alone, or may be used in combination, and in order to obtain absorption in the entire visible light region, it is preferable to combine two or more kinds of dichroic dyes, and it is more preferable to combine three or more kinds of dichroic dyes. In particular, by mixing two or more kinds of dichroic dyes having different absorption wavelengths, polarizing films having various hues can be produced, and a polarizing film having absorption in the entire visible light region can be obtained.

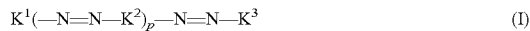

(I)

[In the formula (I), $K^1$ and $K^3$ each independently represent a phenyl group optionally having a substituent, a naphthyl group optionally having a substituent, a benzoic acid phenyl ester group optionally having a substituent, or a monovalent heterocyclic group optionally having a substituent; $K^2$ represents a p-phenylene group optionally having a substituent, a naphthalene-1,4-diyl group optionally having a substituent, a 4,4'-stilbenylene group optionally having a substituent, or a divalent heterocyclic group optionally having a substituent; p represents an integer of 0 to 4; if p is an integer of 2 or more, a plurality of $K^2$s may be the same or different from one another; and an —N═N— bond may be replaced by a —C═C—, —COO—, —NHCO—, or —N═CH— bond in a range showing absorption in the visible range.]

Examples of the monovalent heterocyclic group include groups in which one hydrogen atom is removed from heterocyclic compounds such as quinoline, thiazole, benzothiazole, thienothiazole, imidazole, benzimidazole, oxazole and benzoxazole. Examples of the divalent heterocyclic group include groups in which two hydrogen atoms are removed from the above heterocyclic compounds.

Examples of the substituent which is arbitrarily possessed by a phenyl group, a naphthyl group, a benzoic acid phenyl ester group, and a monovalent heterocyclic group in $K^1$ and $K^3$, as well as a p-phenylene group, a naphthalene-1,4-diyl group, a 4,4'-stilbenylene group, and a divalent heterocyclic group in $K^2$ include alkyl groups having 1 to 20 carbon atoms, alkyl groups having 1 to 20 carbon atoms having a polymerizable group, alkenyl groups having 1 to 4 carbon atoms; alkoxy groups having 1 to 20 carbon atoms such as a methoxy group, an ethoxy group and a butoxy group; alkoxy groups having 1 to 20 carbon atoms having a polymerizable group; fluorinated alkyl groups having 1 to 4 carbon atoms such as a trifluoromethyl group; a cyano group; a nitro group; halogen atoms; and substituted and unsubstituted amino groups such as an amino group, a diethylamino group, and a pyrrolidine group (the substituted amino group means an amino group having one or two alkyl groups having 1 to 6 carbon atoms, an amino group having one or two alkyl groups having 1 to 6 carbon atoms having a polymerizable group, or an amino group in which two substituted alkyl groups are bound with each other to form an alkanediyl group having 2 to 8 carbon atoms; and the unsaturated amino group is —NH$_2$). Examples of the polymerizable group include a (meth)acryloyl group and a (meth)acryloyloxy group.

Among the compounds (I), a compound represented by any one of the following formulas (I-1) to (I-8) is preferable.

[Chemical Formula 1]

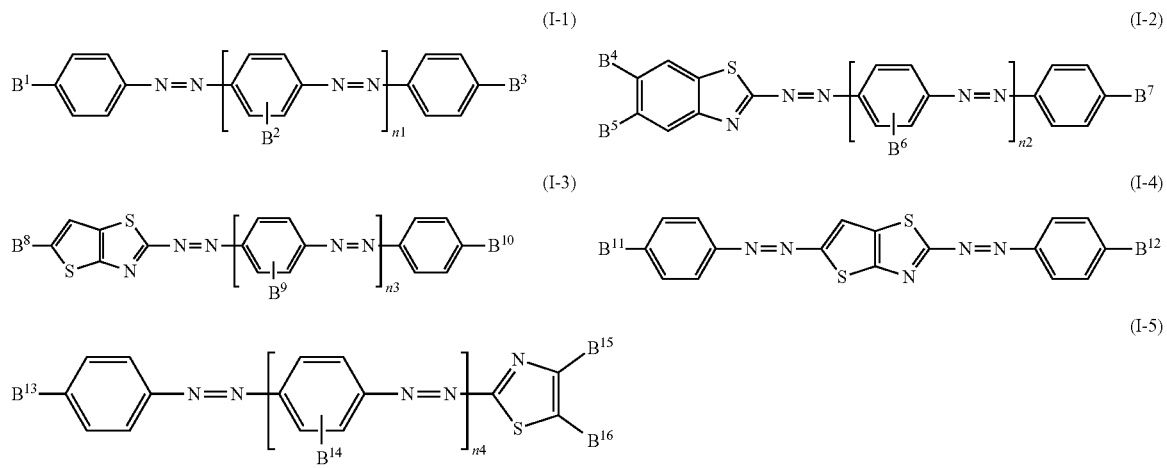

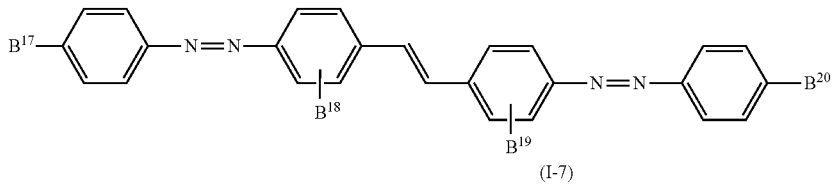

(I-6)

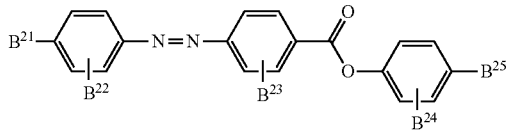

(I-7)

(I-8)

[In the formulas (I-1) to (I-8), $B^1$ to $B^{30}$ each independently represent a hydrogen atom, an alkyl group having 1 to 6 carbon atoms, an alkenyl group having 1 to 6 carbon atoms, an alkoxy group having 1 to 4 carbon atoms, a cyano group, a nitro group, a substituted or unsubstituted amino group (definition of the substituted amino group and the unsubstituted amino group is as described above), a chlorine atom or a trifluoromethyl group;

n1 to n4 each independently represent an integer of 0 to 3;

if n1 is 2 or more, a plurality of $B^2$s may be the same or different from one another;

if n2 is 2 or more, a plurality of $B^6$s may be the same or different from one another;

if n3 is 2 or more, a plurality of $B^9$s may be the same or different from one another; and if n4 is 2 or more, a plurality of Br's may be the same or different from one another.]

As the anthraquinone dye, a compound represented by the formula (1-9) is preferable:

[Chemical Formula 2]

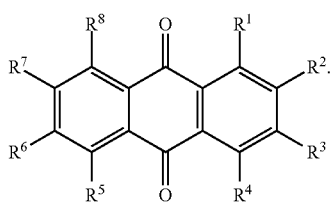

(I-9)

[In the formula (I-9), $R^1$ to $R^8$ each independently represent a hydrogen atom, $-R^x$, $-NH_2$, $-NHR^x$, $-NR^x_2$, $-SR^x$, or a halogen atom; and $R^x$ represents an alkyl group having 1 to 6 carbon atoms or an aryl group having 6 to 12 carbon atoms.]

As the oxazine dye, a compound represented by the formula (I-10) is preferable:

[Chemical Formula 3]

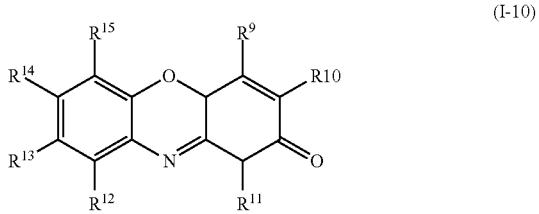

(I-10)

[In the formula (I-10), $R^9$ to $R^{15}$ each independently represent a hydrogen atom, $-R^x$, $-NH_2$, $-NHR^x$, $-NR^x_2$, $-SR^x$, or a halogen atom; and $R^x$ represents an alkyl group having 1 to 6 carbon atoms or an aryl group having 6 to 12 carbon atoms.]

As the acridine dye, a compound represented by the formula (I-11) is preferable:

[Chemical Formula 4]

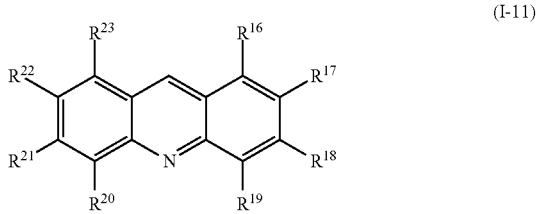

(I-11)

[In the formula (I-11), $R^{16}$ to $R^{23}$ each independently represent a hydrogen atom, $-R^x$, $-NH_2$, $-NHR^x$, $-NR^x_2$, $-SR^x$, or a halogen atom; and $R^x$ represents an alkyl group having 1 to 6 carbon atoms or an aryl group having 6 to 12 carbon atoms.]

In the formulas (I-9), (I-10), and (I-11), examples of the alkyl group having 1 to 6 carbon atoms of $R^x$ include a methyl group, an ethyl group, a propyl group, a butyl group, a pentyl group, and a hexyl group, and examples of the aryl group having 6 to 12 carbon atoms include a phenyl group, a toluyl group, a xylyl group, and a naphthyl group.

As the cyanine dye, a compound represented by the formula (I-12) and a compound represented by the formula (I-13) are preferable:

[Chemical Formula 5]

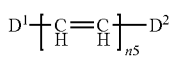
(I-12)

[In the formula (I-12),

D¹ and D² each independently represent a group represented by any one of the formulas (I-12a) to (I-12d); and

[Chemical Formula 6]

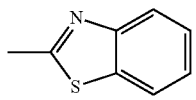
(I-12a)

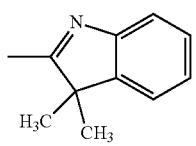
(I-12b)

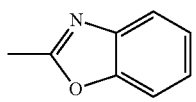
(I-12c)

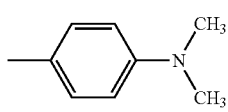
(I-12d)

n5 represents an integer of 1 to 3.]

[Chemical Formula 7]

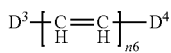
(I-13)

[In the formula (I-13),

D³ and D⁴ each independently represent a group represented by any one of the formulas (I-13a) to (I-13h); and

[Chemical Formula 8]

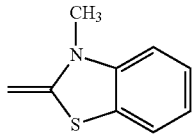
(I-13a)

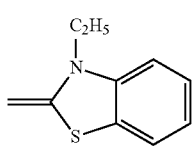
(I-13b)

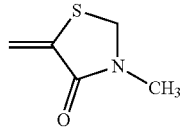
(I-13c)

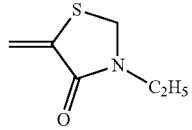
(I-13d)

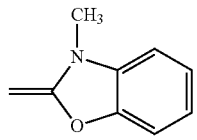
(I-13e)

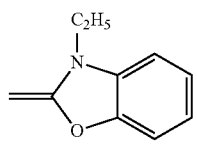
(I-13f)

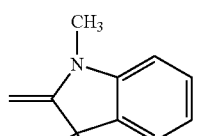
(I-13g)

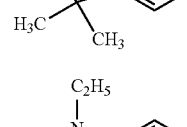
(I-13h)

n6 represents an integer of 1 to 3.]

Among these dichroic dyes, the azo dye is easily decomposed and decolorized by laser irradiation, has high linearity, and thus is suitable for producing the light absorption anisotropic layer (polarizing layer) having excellent polarizing performance. Therefore, in one embodiment of the present invention, the dichroic dye forming the light absorption anisotropic layer is preferably an azo dye.

In the present invention, a weight average molecular weight of the dichroic dye is usually 300 to 2000 and preferably 400 to 1000.

In one embodiment of the present invention, the dichroic dye forming the light absorption anisotropic layer is preferably hydrophobic. When the dichroic dye is hydrophobic, compatibility between the liquid crystal compound and the dichroic dye is improved when the liquid crystal compound is contained, the dichroic dye and the liquid crystal compound form a uniform phase state, and a light absorption anisotropic layer having a high degree of orientation order can be obtained. In the present invention, the hydrophobic dichroic dye means a dye having a solubility of 1 g or less in 100 g of water at 25° C.

In the light absorption anisotropic layer of the optical laminate of the present invention, the first region and the second region usually have different contents of the dichroic dye. The content of the dichroic dye can be appropriately determined according to the type of the dichroic dye to be used and the like. For example, when the light absorption anisotropic layer is formed of a composition containing the dichroic dye and the liquid crystal compound, the amount thereof is usually 1 to 60 parts by mass, preferably 0.1 to 30 parts by mass, more preferably 1 to 20 parts by mass, and still more preferably 1 to 15 parts by mass, with respect to 100 parts by mass of the liquid crystal compound in the region having polarization characteristics such as the first region. When the content of the dichroic dye is less than this range, light absorption may be insufficient, so that sufficient polarizing performance may not be obtained, and when the content is more than this range, orientation of liquid crystal molecules may be inhibited.

On the other hand, since the second region is a region formed by decomposing and decoloring the dichroic dye by laser irradiation, the content of the dichroic dye is usually smaller than that of the first region. The content of the dichroic dye in the second region is preferably sufficiently low so that a desired visibility correction transmittance can be obtained in the second region.

The content of the dichroic dye in the light absorption anisotropic layer can be determined, for example, by measuring the absorbance at a maximum absorption wavelength ($\lambda_{MAX}$) of the dichroic dye.

The light absorption anisotropic layer is preferably a layer formed of a polymerizable liquid crystal composition (hereinafter, also referred to as "composition for light absorption anisotropic layer formation") containing at least one liquid crystal compound in addition to the dichroic dye, preferably containing a polymerizable liquid crystal compound and the dichroic dye.

The polymerizable liquid crystal compound (hereinafter, also referred to as a "polymerizable liquid crystal compound (A)") which forms the light absorption anisotropic layer of the present invention is a compound having at least one polymerizable group. Here, the polymerizable group refers to a group that can be involved in polymerization reaction by an active radial, an acid, or the like generated from a polymerization initiator. Examples of the photopolymerizable group of the polymerizable liquid crystal compound (A) include a vinyl group, a vinyloxy group, a 1-chlorovinyl group, an isopropenyl group, a 4-vinylphenyl group, a (meth)acryloyl group, a (meth)acryloyloxy group, an oxylanyl group, and an oxetanyl group. Among them, a (meth) acryloyl group, a (meth)acryloyloxy group, a vinyloxy group, an oxylanyl group, and an oxetanyl group are preferable, and a (meth)acryloyl group or a (meth)acryloyloxy group is more preferable. Although the liquid crystallinity may be a thermotropic liquid crystal or a lyotropic liquid crystal, a thermotropic liquid crystal is preferable at the time of mixing with the dichroic dye described later. When the polymerizable liquid crystal compound which forms the light absorption anisotropic layer has the same functional group (polymerizable group) as a functional group of a compound which forms an orientation film for forming the light absorption anisotropic layer described later, for example, a (meth)acryloyl group, compatibility between the orientation film and the light absorption anisotropic layer is high, and excellent adhesion between the layers can be exhibited.

In the present invention, when the polymerizable liquid crystal is a thermotropic liquid crystal, the polymerizable liquid crystal may be a thermotropic liquid crystal compound exhibiting a nematic liquid crystal phase or a thermotropic liquid crystal compound exhibiting a smectic liquid crystal phase. When the polarizing function is exhibited as a cured film by the polymerization reaction, a liquid crystal state exhibited by the polymerizable liquid crystal compound is preferably a smectic liquid crystal phase, and a higher order smectic phase is more preferable from the viewpoint of high performance. Among them, higher order smectic liquid crystal compounds forming a smectic B phase, a smectic D phase, a smectic E phase, a smectic F phase, a smectic G phase, a smectic H phase, a smectic I phase, a smectic J phase, a smectic K phase, or a smectic L phase are more preferable, and higher order smectic liquid crystal compounds forming a smectic B phase, a smectic F phase, or a smectic I phase are still more preferable. When the liquid crystal phase formed by the polymerizable liquid crystal is these higher order smectic phases, a polarizing film having higher polarizing performance can be produced. The polymerizable liquid crystal compound (A) may be a monomer, and may be an oligomer in which a polymerizable group is polymerized or a polymer.

The polymerizable liquid crystal compound (A) is not particularly limited as long as it is a liquid crystal compound having at least one polymerizable group, and a known polymerizable liquid crystal compound can be used. Among them, examples of the polymerizable liquid crystal compound capable of exhibiting (higher order) smectic liquid crystallinity include a compound represented by the following formula (A1) (hereinafter may be referred to as a "polymerizable liquid crystal compound (A1)").

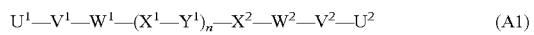

$$U^1-V^1-W^1-(X^1-Y^1)_n-X^2-W^2-V^2-U^2 \quad (A1)$$

[In the formula (A1), $X^1$ and $X^2$ each independently represent a divalent aromatic group or a divalent alicyclic hydrocarbon group, wherein a hydrogen atom contained in the divalent aromatic group or the divalent alicyclic hydrocarbon group may be substituted with a halogen atom, an alkyl group having 1 to 4 carbon atoms, a fluoroalkyl group having 1 to 4 carbon atoms, an alkoxy group having 1 to 4 carbon atoms, a cyano group, or a nitro group, and a carbon atom constituting the divalent aromatic group or the divalent alicyclic hydrocarbon group may be substituted with an oxygen atom, a sulfur atom, or a nitrogen atom, provided that at least one of $X^1$ and $X^2$ is a 1,4-phenylene group optionally having a substituent or a cyclohexane-1,4-diyl group optionally having a substituent;

$Y^1$ is a single bond or a divalent linking group;

when n is 1 to 3 and n is 2 or more, a plurality of $X^1$s may be the same or different from one another; $X^2$ may be the same as or different from any or all of the plurality of $X^1$s; when n is 2 or more, a plurality of $Y^1$s may be the same or different from one another; n is preferably 2 or more from the viewpoint of liquid crystallinity;

$U^1$ represents a hydrogen atom or a polymerizable group;

$U^2$ represents a polymerizable group;

$W^1$ and $W^2$ are each independently a single bond or a divalent linking group;

$V^1$ and $V^2$ each independently represent an alkanediyl group having 1 to 20 carbon atoms which may have a substituent; and —$CH_2$— constituting the alkanediyl group may be replaced with —O—, —CO—, —S— or NH—.]

In the polymerizable liquid crystal compound (A1), $X^1$ and $X^2$ are each independently preferably a 1,4-phenylene group optionally having a substituent or a cyclohexane-1,4-diyl group optionally having a substituent, at least one of $X^1$ and $X^2$ is preferably a 1,4-phenylene group optionally having a substituent or a cyclohexane-1,4-diyl group optionally having a substituent, and a trans-cyclohexane-1,4-diyl group. Examples of the substituent optionally included in the 1,4-phenylene group optionally having a substituent or the cyclohexane-1,4-diyl group optionally having a substituent include alkyl groups having 1 to 4 carbon atoms such as a methyl group, an ethyl group, and a butyl group; a cyano group; and halogen atoms such as a chlorine atom and a fluorine atom. It is preferably unsubstituted.

In the polymerizable liquid crystal compound (A1), a site [hereinafter, also referred to as a partial structure (A1-1)] represented by the formula (A1-1):

$$-(X^1-Y^1)_n-X^2- \quad (A1\text{-}1)$$

[where $X^1$, $Y^1$, $X^2$, and n each have the same meaning as described above] in the formula (A1) preferably has an asymmetric structure from the viewpoint of easily exhibiting smectic liquid crystallinity.

Examples of the polymerizable liquid crystal compound (A1) in which the partial structure (A1-1) is an asymmetric structure include the polymerizable liquid crystal compound (A1) in which n is 1, and one $X^1$ and one $X^2$ are different structures from each other. Further, the polymerizable liquid crystal compound (A1) which is a compound in which n is 2 and two Y's are the same structure as each other, and in which two $X^1$s are the same structure as each other and one $X^2$ is a structure different from these two $X^1$s, and the polymerizable liquid crystal compound (A1) in which $X^1$ bonded to $W^1$ of two $X^1$s is a structure different from the other $X^1$ and $X^2$, and the other $X^1$ and $X^2$ are the same structure as each other can be mentioned. Furthermore, the polymerizable liquid crystal compound (A1) which is a compound in which n is 3 and three $Y^1$s are the same structure as each other, and in which any one of three $X^1$s and one $X^2$ is a structure different from all the other three's can be mentioned.

$Y^1$ is preferably —CH$_2$CH$_2$—, —CH$_2$O—, —CH$_2$CH$_2$O—, —COO—, —OCOO—, a single bond, —N=N—, —CR$^a$=CR$^b$—, —C≡C—, —CR$^a$=N—, or —CO—NR$^a$—. R$^a$ and R$^b$ each independently represent a hydrogen atom or an alkyl group having 1 to 4 carbon atoms. $Y^1$ is more preferably —CH$_2$CH$_2$—, —COO—, or a single bond, and when there are a plurality of $Y^1$s, $Y^1$ bonded to $X^2$ is more preferably —CH$_2$CH$_2$— or CH$_2$O—. When $X^1$ and $X^2$ are all the same structure, it is preferable that there are two or more $Y^1$s having different bonding methods from each other. When there are the plurality of $Y^1$s having different bonding methods from each other, an asymmetrical structure is formed, so that smectic liquid crystallinity tends to be easily exhibited.

$U^2$ represents a polymerizable group. $U^1$ is a hydrogen atom or a polymerizable group, and preferably a polymerizable group. Both of $U^1$ and $U^2$ are preferably polymerizable groups, and preferably radically polymerizable groups. Examples of the polymerizable group include the same groups as those exemplified above as the polymerizable group of the polymerizable liquid crystal compound (A). The polymerizable group represented by $U^1$ and the polymerizable group represented by $U^2$ may be different from each other, and are preferably the same type of group, at least one of $U^1$ and $U^2$ is preferably a (meth)acryloyl group, and both are more preferably a (meth)acryloyl group. The polymerizable group may be in a polymerized state or in an unpolymerized state, and is preferably in the unpolymerized state.

Examples of the alkanediyl group represented by $V^1$ and $V^2$ include a methylene group, an ethylene group, a propane-1,3-diyl group, a butane-1,3-diyl group, a butane-1,4-diyl group, a pentane-1,5-diyl group, a hexane-1,6-diyl group, a heptane-1,7-diyl group, an octane-1,8-diyl group, a decane-1,10-diyl group, a tetradecane-1,14-diyl group, and an eicosane-1,20-diyl group. Each of $V^1$ and $V^2$ is preferably an alkanediyl group having 2 to 12 carbon atoms, and more preferably an alkanediyl group having 6 to 12 carbon atoms.

Examples of the substituent that the alkanediyl group optionally has include a cyano group, and halogen atoms, and the alkanediyl group is preferably unsubstituted, and more preferably an unsubstituted linear alkanediyl group.

$W^1$ and $W^2$ are, each independently, preferably single bond, —O—, —S—, —COO—, or —OCOO—, and more preferably single bond or —O—.

The polymerizable liquid crystal compound (A) is not particularly limited as long as it is a polymerizable liquid crystal compound having at least one polymerizable group, and a known polymerizable liquid crystal compound can be used; however, it is preferable to exhibit the smectic liquid crystallinity, as a structure that easily exhibits the smectic liquid crystallinity, it is preferable to have an asymmetric molecular structure in a molecular structure, and specifically, it is more preferable to use a polymerizable liquid crystal compound having the following partial structures (A-a) to (A-i) and exhibiting the smectic liquid crystallinity. It is more preferable to have a partial structure of (A-a), (A-b), or (A-c) from the viewpoint of easily exhibiting higher order smectic liquid crystallinity. In the following (A-a) to (A-i), * represents a bond (single bond).

[Chemical Formula 9]

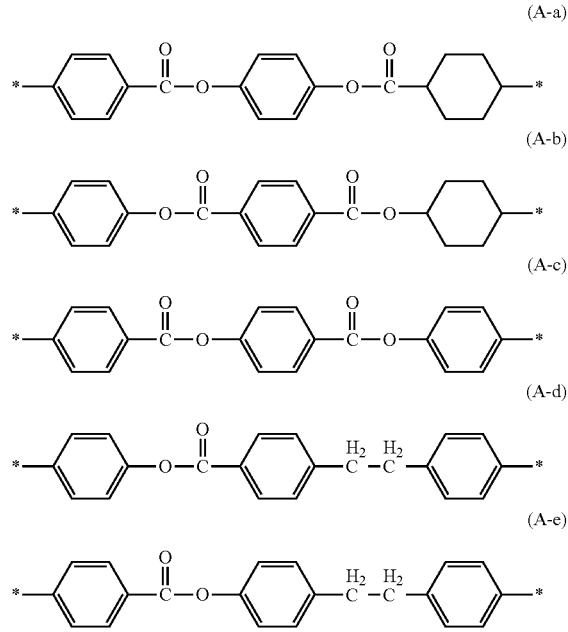

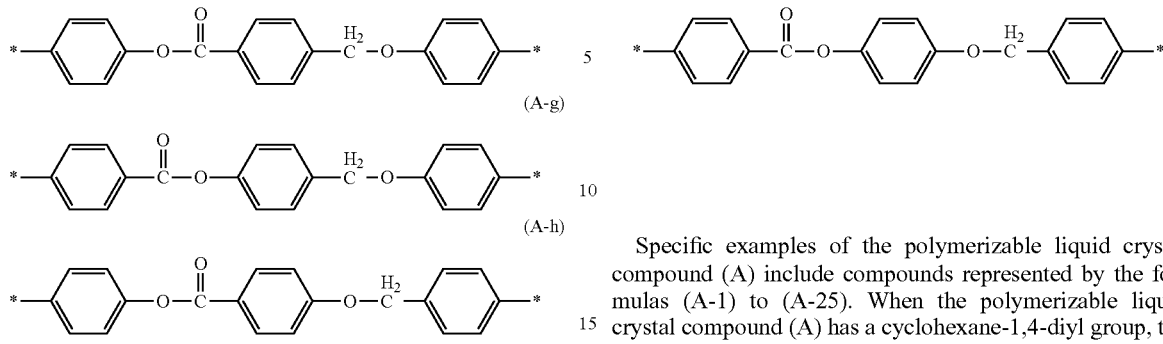
Specific examples of the polymerizable liquid crystal compound (A) include compounds represented by the formulas (A-1) to (A-25). When the polymerizable liquid crystal compound (A) has a cyclohexane-1,4-diyl group, the cyclohexane-1,4-diyl group is preferably a trans type.
[Chemical Formula 10]
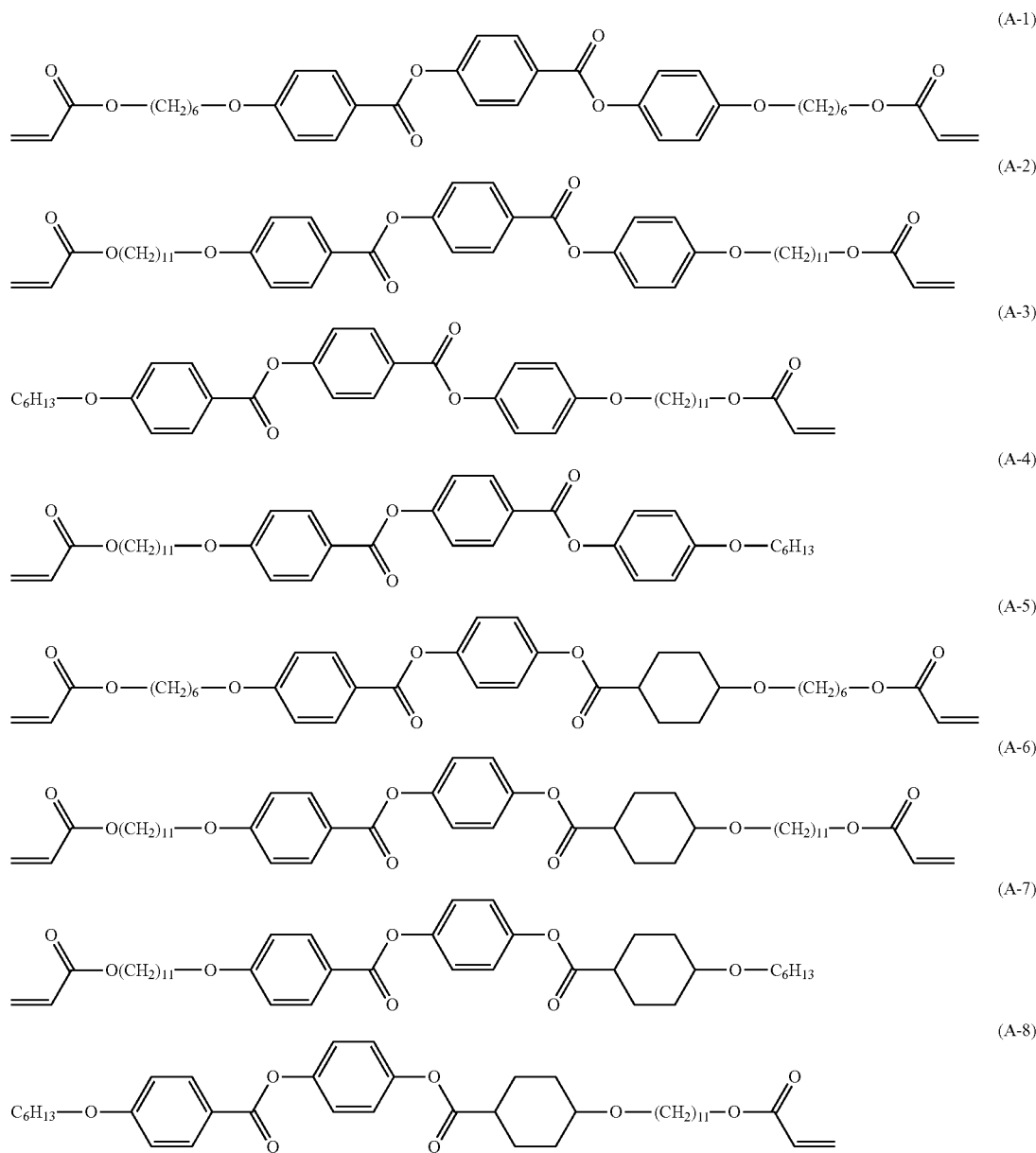

[Chemical Formula 11]
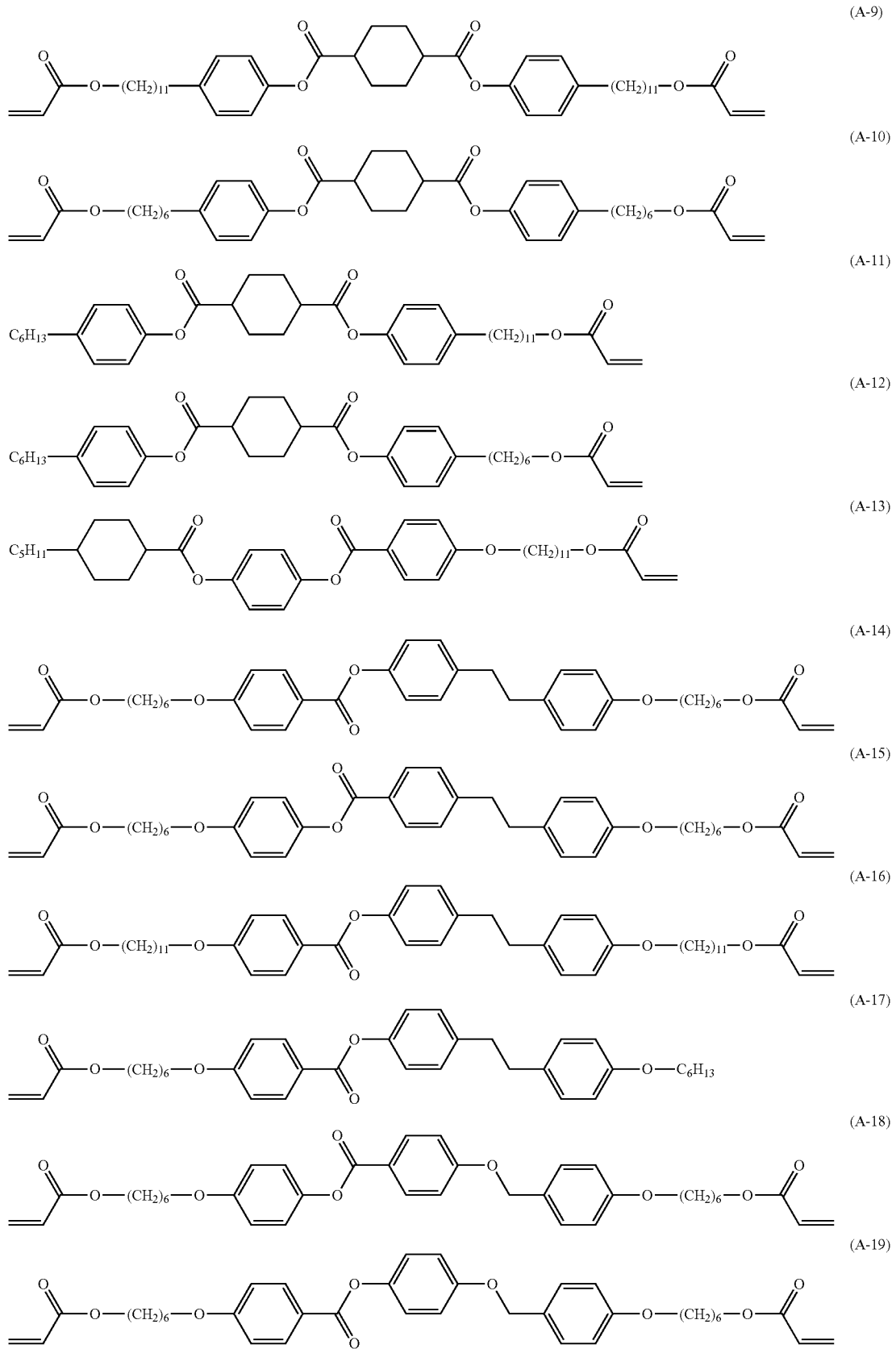

(A-20)
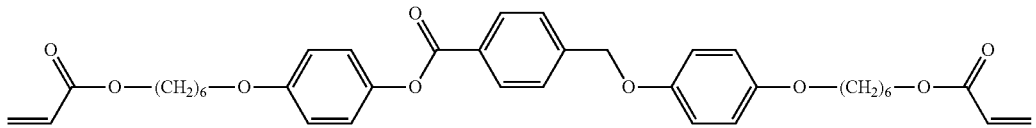

[Chemical Formula 12]

(A-21)
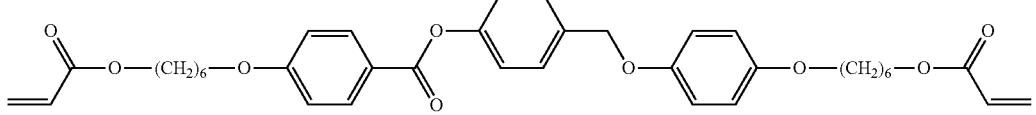

(A-22)
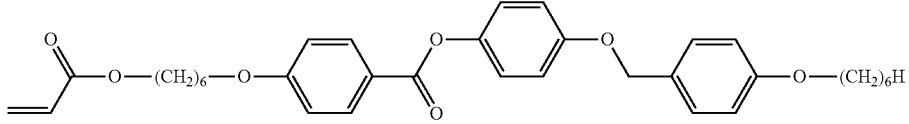

(A-23)
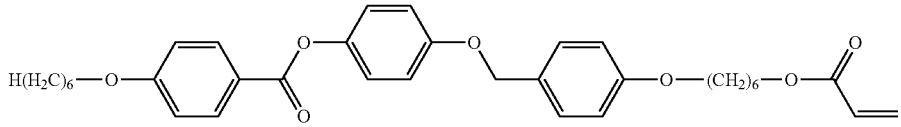

(A-24)
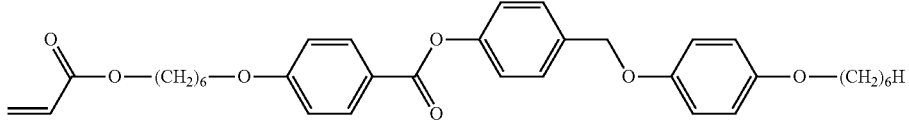

(A-25)
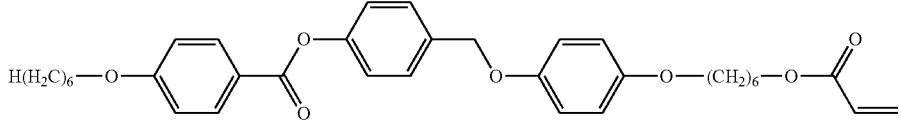

Among them, at least one type, selected from the group consisting of compounds represented by the formula (A-2), formula (A-3), formula (A-4), formula (A-5), formula (A-6), formula (A-7), formula (A-8), formula (A-13), formula (A-14), formula (A-15), formula (A-16), and formula (A-17), is preferable. As the polymerizable liquid crystal compound (A), one type may be used alone, or two or more types may be used in combination.

The polymerizable liquid crystal compound (A) can be manufactured by a known method described in, for example, Lub et al., Recl. Tray. Chim. Pays-Bas, 115, 321-328(1996), or JP-B2-4719156.

In the present invention, the composition for light absorption anisotropic layer formation may contain a polymerizable liquid crystal compound other than the polymerizable liquid crystal compound (A); however, from the viewpoint of obtaining a light absorption anisotropic layer having a high degree of orientation order, a ratio of the polymerizable liquid crystal compound (A) to a total mass of all polymerizable liquid crystal compounds contained in the composition for light absorption anisotropic layer formation is preferably 51% by mass or more, more preferably 70% by mass or more, and still more preferably 90% by mass or more.

When the composition for light absorption anisotropic layer formation contains two or more polymerizable liquid crystal compounds (A), at least one of them may be the polymerizable liquid crystal compound (A1), and all of them may be the polymerizable liquid crystal compounds (A1). Combination of a plurality of polymerizable liquid crystal compounds may make it possible to temporarily keep the crystallinity even at a temperature not more than the liquid crystal-crystal phase transition temperature.

The content of the polymerizable liquid crystal compound in the composition for light absorption anisotropic layer formation is preferably 50 to 99.9% by mass, more preferably 60 to 99% by mass, and still more preferably 70 to 98% by mass, with respect to the solid content of the composition for light absorption anisotropic layer formation. When the content of the polymerizable liquid crystal compound is within the above range, the orientation of the polymerizable liquid crystal compound tends to be high. In the present specification, the solid content refers to a total amount of components obtained by removing a solvent from the polymerizable liquid crystal composition.

In the present invention, the composition for light absorption anisotropic layer formation used for forming the light absorption anisotropic layer may contain a polymerization initiator. The polymerization initiator is a compound capable of initiating the polymerization reaction of the polymerizable liquid crystal compound, and is preferably a photopolymerization initiator in that the polymerization reaction can be initiated under lower temperature conditions. Specifically, a photopolymerization initiator capable of generating an active radical or an acid by light action can be mentioned, and in particular, a photopolymerization initiator that generates a radical by the light action is preferable from the viewpoint of not depending on a phase state of the thermotropic liquid crystal. The polymerization initiator can be used alone or in combination of two or more.

As the photopolymerization initiator, a known photopolymerization initiator can be used, and examples of the photopolymerization initiator which generates an active radical include a self-cleaving photopolymerization initiator and a hydrogen abstraction type photopolymerization initiator.

As the self-cleaving photopolymerization initiator, self-cleaving benzoin-based compound, acetophenone-based compound, hydroxyacetophenone-based compound, α-aminoacetophenone-based compound, oxime ester-based compound, an acylphosphine oxide-based compound, azo-based compound, and the like can be used. As the hydrogen abstraction type photopolymerization initiator, hydrogen abstraction type benzophenone-based compound, alkylphenone-based compound, benzoin ether-based compound, benzyl ketal-based compound, dibenzosuberone-based compound, anthraquinone-based compound, xanthone-based compound, thioxanthone-based compound, halogenoacetophenone-based compound, dialkoxyacetophenone-based compound, halogenobisimidazole-based compound, halogenotriazine-based compound, a triazine compound, and the like can be used.

As the photopolymerization initiator which generates an acid, an iodonium salt, a sulfonium salt, and the like can be used.

Among them, a reaction at a low temperature is preferable from the viewpoint of preventing dissolution of a dye, the self-cleaving photopolymerization initiator is preferable from the viewpoint of reaction efficiency at a low temperature, and particularly, an acetophenone-based compound, a hydroxyacetophenone-based compound, an α-aminoacetophenone-based compound, and an oxime ester-based compound are preferable.

Specific examples of the photopolymerization initiator include the following:
benzoin compounds such as benzoin, benzoin methyl ether, benzoin ethyl ether, benzoin isopropyl ether, and benzoin isobutyl ether;
hydroxyacetophenone-based compounds such as oligomers of 2-hydroxy-2-methyl-1-phenylpropan-1-one, 1,2-diphenyl-2,2-dimethoxyethan-1-one, 2-hydroxy-2-methyl-1-[4-(2-hydroxyethoxy)phenyl]propan-1-one, 1-hydroxycyclohexyl phenyl ketone, and 2-hydroxy-2-methyl-1-[4-(1-methylvinyl)phenyl]propan-1-one;
α-aminoacetophenone-based compounds such as 2-methyl-2-morpholino-1-(4-methylthiophenyl)propane-1-one and 2-dimethylamino-2-benzyl-1-(4-morpholinophenyl)butane-1-one;
oxime ester-based compounds such as 1,2-octanedione, 1-[4-(phenylthio)-, 2-(O-benzyloxime)], ethanone, 1-[9-ethyl-6-(2-methylbenzoyl)-9H-carbazole-3-yl]-, and 1-(O-acetyloxime); acylphosphine oxide-based compounds such as 2,4,6-trimethylbenzoyldiphenylphosphine oxide and bis(2,4,6-trimethylbenzoyl)phenylphosphine oxide;
benzophenone compounds such as benzophenone, methyl o-benzoylbenzoate, 4-phenylbenzophenone, 4-benzoyl-4'-methyldiphenyl sulfide, 3,3',4,4'-tetra(tert-butylperoxycarbonyl)benzophenone, and 2,4,6-trimethylbenzophenone;
dialkoxyacetophenone-based compounds such as diethoxyacetophenone; and triazine-based compounds such as 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-(4-methoxystyryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl) ethenyl]-1,3,5-triazine, and 2,4-bis(trichloromethyl)-6-[2-(3,4-dimethoxyphenyl)ethenyl]-1,3,5-triazine. The photopolymerization initiator may be appropriately selected, for example, from the photopolymerization initiators described above in relation to the polymerizable liquid crystal compound contained in the composition for light absorption anisotropic layer formation.

In addition, a commercially available photopolymerization initiator may be used. Examples of commercially available polymerization initiators include Irgacure (registered trademark) 907, 184, 651, 819, 250, and 369, 379, 127, 754, OXE01, OXE02, and OXE03 (manufactured by BASF SE); Omnirad BCIM, Esacure 1001 M, Esacure KIP 160 (manufactured by IDM Resins B.V.); SEIKUOL (registered trademark) BZ, Z, and BEE (manufactured by Seiko Chemical Co., Ltd.); Kayacure (registered trademark) BP100 and UVI-6992 (manufactured by The Dow Chemical Company); ADEKA OPTOMER SP-152, N-1717, N-1919, SP-170, ADEKA ARKLS NCI-831, ADEKA ARKLS NCI-930 (manufactured by ADEKA); TAZ-A and TAZ-PP (manufactured by Nihon Siberllegner K.K.); and TAZ-104 (manufactured by Sanwa Chemical Co., Ltd.).

The content of the polymerization initiator in the composition for light absorption anisotropic layer formation is preferably 0.1 to 10 parts by mass, more preferably 0.5 to 8 parts by mass, still more preferably 2 to 8 parts by mass, and particularly preferably 4 to 8 parts by mass, with respect to 100 parts by mass of the polymerizable liquid crystal compound. When the content of the polymerization initiator is within the above range, the polymerization reaction of the polymerizable liquid crystal compound can be performed without greatly disturbing the orientation of the polymerizable liquid crystal compound.

The composition for light absorption anisotropic layer formation may contain a leveling agent. The leveling agent has a function of adjusting the fluidity of the composition for light absorption anisotropic layer formation and making a coating film, which is obtained by application of the composition, flatter, and specific examples thereof include a surfactant. Examples of the leveling agent include organic modified silicone oil-based leveling agents, polyacrylate-based leveling agents, and perfluoroalkyl-based leveling agents. Among these, a polyacrylate-based leveling agent and a perfluoroalkyl-based leveling agent are preferable. The leveling agents can be used alone or in combination of two or more.

Examples of the polyacrylate-based leveling agent include "BYK-350", "BYK-352", "BYK-353", "BYK-354", "BYK-355", "BYK-358N", "BYK-361N", "BYK-380", "BYK-381", and "BYK-392" (manufactured by BYK Chemie).

Examples of the perfluoroalkyl-based leveling agent include "Megafac (registered trademark) R-08", "Megafac R-30", "Megafac R-90", "Megafac F-410", "Megafac F-411", "Megafac F-443", "Megafac F-445", "Megafac F-470", "Megafac F-471", "Megafac F-477", "Megafac F-479", "Megafac F-482", "Megafac F-483" (DIC Corporation); "SURFLON (registered trademark) S-381", "SURFLON S-382", "SURFLON S-383", "SURFLON S-393", "SURFLON SC-101", "SURFLON SC-105", "KH-40", and "SA-100" (AGC Seimi Chemical Co., Ltd.); "E1830" and "E5844 (Daikin Fine Chemical Co., Ltd.); and "EFTOP EF301", "EFTOP EF303", "EFTOP EF351," and "EFTOP EF352" (Mitsubishi Materials Electronic Chemicals Co., Ltd.).

When the composition for light absorption anisotropic layer formation contains the leveling agent, the content of the leveling agent is preferably 0.01 to 5 parts by mass, and more preferably 0.05 to 3 parts by mass, with respect to 100 parts by mass of the liquid crystal compound. When the content of the leveling agent is within the above range, it is made easy to horizontally orientate the polymerizable liquid crystal compound, and an optically anisotropic layer to be obtained tends to be smoother. If the content of the leveling agent to the polymerizable liquid crystal compound exceeds the above range, the optically anisotropic layer to be obtained easily tends to be uneven.

The composition for light absorption anisotropic layer formation may contain an additive other than the leveling agent. Examples of other additives include colorants such as a photosensitizer, an antioxidant, a mold release agent, a stabilizer, and a bluing agent, a flame retardant, and a lubricant. When the composition for light absorption anisotropic layer formation contains other additives, the content of the other additives is preferably more than 0% and 20% by mass or less, and more preferably more than 0% and 10% by mass or less with respect to the solid content of the composition for light absorption anisotropic layer formation.

The composition for light absorption anisotropic layer formation can be produced by a conventionally known method of preparing the composition for light absorption anisotropic layer formation, and usually can be prepared by mixing and stirring a liquid crystal compound, a dichroic dye, and, if necessary, a polymerization initiator, the above-described additives, and the like. Since a compound generally exhibiting the smectic liquid crystallinity has a high viscosity, the viscosity may be adjusted by adding a solvent to the composition for light absorption anisotropic layer formation from the viewpoint of improving the coatability of the composition for light absorption anisotropic layer formation to facilitate the formation of the light absorption anisotropic layer.

The solvent used in the composition for light absorption anisotropic layer formation can be appropriately selected according to the solubility of the liquid crystal compound and the dichroic dye to be used, and the like. Specifically, solvents similar to those exemplified as the solvents that can be used for forming the first protective layer can be mentioned. The content of the solvent is preferably 100 to 1900 parts by mass, more preferably 150 to 900 parts by mass, and still more preferably 180 to 600 parts by mass, with respect to 100 parts by mass of the solid content of the composition for light absorption anisotropic layer formation.

In the present invention, the light absorption anisotropic layer is preferably a polarizer having a high degree of orientation order. In the polarizer having a high degree of orientation order, a Bragg peak derived from a higher order structure such as a hexatic phase or a crystal phase in X-ray diffractometry is obtained. The Bragg peak means a peak derived from the periodic structure of molecular orientation. Therefore, it is preferable that the light absorption anisotropic layer (polarizing layer) constituting the optical laminate of the present invention exhibits the Bragg peak in X-ray diffractometry. That is, in the light absorption anisotropic layer constituting the optical laminate of the present invention, the (polymerizable) liquid crystal compound or a polymer thereof is preferably oriented such that the light absorption anisotropic layer exhibits the Bragg peak in X-ray diffractometry, and more preferably "horizontally oriented" such that molecules of the liquid crystal compound are oriented in a light absorbing direction. In the present invention, a polarizer having a plane periodic interval of the molecular orientation of 3.0 to 6.0 Å is preferable. The high degree of orientation order exhibiting the Bragg peak can be achieved by controlling the type of liquid crystal compound to be used, the type and amount of dichroic dye, the type and amount of polymerization initiator, and the like.

In the present invention, the light absorption anisotropic layer can be obtained, for example, by a method including: forming a coating film of the composition for light absorption anisotropic layer formation on an orientation layer described later; removing a solvent from the coating film; increasing temperature to a temperature equal to or higher than a temperature at which the liquid crystal compound undergoes phase transition to a liquid phase and then lowering the temperature to cause the liquid crystal compound to undergo phase transition to a liquid crystal phase (for example, a smectic phase); and curing (polymerizing) the liquid crystal compound while maintaining the liquid crystal phase.

Examples of the method of applying the composition for light absorption anisotropic layer formation to an orientation layer include the same methods as those described above as the method of applying the composition for protective layer formation to a substrate or the like when the first protective layer is formed.

Next, under the condition that the liquid crystal compound contained in the coating film obtained from the composition for light absorption anisotropic layer formation is not cured (polymerized), the solvent is removed by drying or the like to form a dried coating film. Examples of the drying method include a natural drying method, ventilation drying method, heat drying method, and decompression drying method.

In addition, in order to cause the liquid crystal compound to undergo phase transition to the liquid phase, the temperature is raised to a temperature equal to or higher than the temperature at which the liquid crystal compound undergoes phase transition to the liquid phase, and then lowered to cause the liquid crystal compound to undergo phase transition to the liquid crystal phase (smectic phase). Such phase transition may be performed after removal of the solvent in the coating film, or may be performed simultaneously with removal of the solvent.

By curing (polymerizing) the liquid crystal compound while maintaining the liquid crystal state of the liquid crystal compound, the light absorption anisotropic layer is formed as a cured product of the composition for light absorption anisotropic layer formation. The curing method is preferably a photopolymerization method. In photopolymerization, the light with which the dried coating film is irradiated is appropriately selected depending on the type of the polymerizable liquid crystal compound (particularly, the type of the polymerizable group of the polymerizable liquid crystal compound) contained in the dried coating film, the type of the polymerization initiator, the amounts thereof, and the like. Specific examples of the light include one or more types of light or active electron beams selected from the group consisting of visible light, ultraviolet light, infrared light, X-rays, α-rays, β-rays, and γ-rays. Among them, ultraviolet light is preferable because it is easy to control the progress of a polymerization reaction and a photopolymerization apparatus widely used in the field can be used, and, it is preferable to select the types of the polymerizable liquid crystal compound and the polymerization initiator contained in the composition for light absorption anisotropic layer formation, so that photopolymerization can be performed by ultraviolet light. At the time of polymerization, a polymerization temperature can also be controlled by irradiating light while cooling the dried coating film with a suitable cooling unit.

Examples of light sources of the active energy rays include a low pressure mercury lamp, a medium pressure mercury lamp, a high pressure mercury lamp, an ultrahigh pressure mercury lamp, a xenon lamp, a halogen lamp, a carbon arc lamp, a tungsten lamp, a gallium lamp, an excimer laser, an LED light source emitting light in a wavelength range of 380 nm to 440 nm, a chemical lamp, a black light lamp, a microwave-excited mercury lamp, and a metal halide lamp.

An ultraviolet irradiation intensity is usually 10 to 3,000 mW/cm$^2$. It is preferable that the ultraviolet irradiation intensity is an intensity within a wavelength region effective for activating the photopolymerization initiator. A period for irradiating the light is usually 0.1 seconds to 10 minutes, preferably 1 seconds to 5 minutes, more preferably 5 seconds to 3 minutes, and still more preferably 10 seconds to 1 minute. When ultraviolet rays are irradiated once or multiple times with such an ultraviolet irradiation intensity, the integrated amount of the light is 10 to 3,000 mJ/cm$^2$, preferably 50 to 2,000 mJ/cm$^2$, and more preferably 100 to 1,000 mJ/cm$^2$. When the integrated amount of the light is equal to or less than this range, curing of the polymerizable liquid crystal compound becomes insufficient, and good transferability may not be obtained. Conversely, when the integrated amount of the light is equal to or more than this range, an optical film including an optically anisotropic layer may be colored.

By performing photopolymerization, the liquid crystal compound is cured (polymerized) while maintaining the liquid crystal state of the liquid crystal phase, particularly the smectic phase, preferably the higher order smectic phase, and a light absorption anisotropic layer is formed. The light absorption anisotropic layer (polarizing layer) obtained by curing (polymerizing) the liquid crystal compound while maintaining the liquid crystal state of the smectic phase has an advantage that the polarizing performance is high as compared with a conventional host-guest type polarizing film, that is, the light absorption anisotropic layer (polarizing layer) having the liquid crystal state of the nematic phase due to the action of the dichroic pigment. In addition, there is also an advantage that strength is excellent as compared with a case where only a dichroic dye or lyotropic liquid crystal is applied.

(Orientation Layer)

In the present invention, the light absorption anisotropic layer is stacked on the orientation layer. The orientation layer has an orientation regulating force by which the liquid crystal compound is liquid-crystal-oriented in a desired direction. By including the orientation layer, the orientation accuracy of the liquid crystal compound is easily improved, and the polarizing performance of the light absorption anisotropic layer is easily improved. The state of crystal liquid orientation such as horizontal orientation, vertical orientation, hybrid orientation, and inclined orientation changes depending on a nature of the orientation film and the polymerizable liquid crystal compound, and a combination thereof can be arbitrarily selected. For example, when the orientation film is a material which manifests horizontal orientation as an orientation regulating force, the polymerizable liquid crystal compound can form horizontal orientation or hybrid orientation, and when the orientation film is a material which manifests vertical orientation, the polymerizable liquid crystal compound can form vertical orientation or inclined orientation. Expression of horizontal, vertical or the like represents a direction of a long axis of an oriented polymerizable liquid crystal compound, based on an optically anisotropic layer plane. For example, vertical orientation is orientation having a long axis of the polymerizable liquid crystal compound which is oriented in a direction vertical to the optically anisotropic layer plane. Vertical mentioned herein means 90°±20° relative to the optically anisotropic layer plane. The orientation layer preferably has solvent resistance not to be dissolved by application of the composition for light absorption anisotropic layer formation, and also has heat resistance to stand a heat treatment for removing a solvent or orientating a liquid crystal compound. In the present invention, examples of the orientation layer include an orientation film containing an orientation polymer, a photo-orientation film, a groove orientation film having an uneven pattern or a plurality of grooves on the surface, and a drawn film drawn in the orientation direction, and a photo-orientation film is preferable from the viewpoint of accuracy of an orientation angle and the quality, water resistance and flexibility of the optical laminate including the orientation layer, and the like. The photo-orientation film is also advantageous because the direction of the orientation regulating force can be arbitrarily controlled by selecting the polarization direction of polarized light to be irradiated.

Examples of the orientational polymer include polyamide and gelatins having an amide bond in the molecule, polyimide having an imide bond in the molecule and a polyamic acid which is a hydrolyzed product of the polyimide, polyvinyl alcohol, alkyl-modified polyvinyl alcohol, polyacrylamide, polyoxazole, polyethyleneimine, polystyrene, polyvinyl pyrrolidone, polyacrylic acid, and a polyacrylic acid esters. Among them, polyvinyl alcohol is preferable. The orientational polymers can be used alone or in combination of two or more.

The orientation film containing an orientational polymer can be usually obtained by applying a composition containing an orientational polymer dissolved in a solvent (hereinafter, may also be referred to as "orientational polymer composition") to a surface on which the orientation layer is to be formed and removing the solvent, or by removing the solvent, and rubbing the composition (rubbing method). Examples of the solvent include the same solvents as those exemplified above as the solvents that can be used for the composition for protective layer formation.

The concentration of the orientational polymer in the orientational polymer composition should be within a range in which an orientational polymer material can be completely dissolved in a solvent, and it is preferably 0.1 to 20% and more preferably about 0.1 to 10% in terms of the solid content with respect to the solution.

As the orientational polymer composition, a commercially available orientation film material may be used as it is. Examples of the commercially available orientation film material include SUNEVER (registered trademark, manufactured by Nissan Chemical Industries, Ltd.) and OPTOMER (registered trademark, manufactured by JSR Corporation).

Examples of the method of applying the orientational polymer composition include the same methods as those exemplified above as the method of applying the composition for protective layer formation to the base material.

Examples of the method of removing the solvent contained in the orientational polymer composition include a natural drying method, a ventilation drying method, heat drying, and a reduced-pressure drying method.

To provide the orientation film with the orientation regulating force, rubbing treatment can be conducted (rubbing method) if necessary. Examples of the method of providing the orientation regulating force by the rubbing method include a method for bringing a film of the orientational polymer, which is formed by applying the orientational polymer composition onto the first protective layer or the like and annealing the orientational polymer composition, into contact with a rotating rubbing roll around which a rubbing cloth is wound. In the rubbing treatment, it is also possible to form an orientation film having multiple areas (patterns) with different orientation directions by a masking treatment.

The photo-orientation film can usually be obtained by applying a composition (hereinafter, also referred to as a "composition for photo-orientation film formation") containing both a polymer, oligomer, or monomer having a photoreactive group (hereinafter, they are also collectively referred to as "photo-orienting polymer") and a solvent onto the surface on which the orientation layer is to be formed and irradiating polarized light (preferably, polarized UV). When the photo-orienting polymer has the same reactive group (for example, (meth)acryloyl group) as the functional group of the curable component that forms the first protective layer, the adhesion between the first protective layer and the orientation layer tends to be improved, and peelability of the base material layer used for forming the first protective layer when forming the light absorption anisotropic layer is easily controlled. This makes it easy to ensure high visibility correction transmittance in the second region.

The photoreactive group refers to a group that generates a liquid crystal orientation ability when irradiated with light. Specific examples thereof include groups involved in photoreactions that are the origin of the liquid crystal orientation ability, such as a molecular orientation induction or isomerization reaction, dimerization reaction, photocrosslinking reaction, or photodecomposition reaction, which are generated by light irradiation. Among them, a group involved in the dimerization reaction or photocrosslinking reaction is preferable because it is excellent in orientation. The photoreactive group is preferably a group having an unsaturated bond, particularly a double bond, and particularly preferably a group having at least one selected from the group consisting of a carbon-carbon double bond (C═C bond), carbon-nitrogen double bond (C═N bond), nitrogen-nitrogen double bond (N═N bond), and carbon-oxygen double bond (C═O bond).

Examples of the photoreactive group having a C═C bond include a vinyl group, polyene group, stilbene group, stilbazole group, stilbazolium group, chalcone group, and cinnamoyl group.

Examples of the photoreactive group having a C═N bond include groups having a structure such as an aromatic Schiff base or aromatic hydrazone. Examples of the photoreactive group having an N═N bond include an azobenzene group, azonaphthalene group, aromatic heterocyclic azo group, bisazo group, formazan group, and group having an azoxybenzene structure. Examples of the photoreactive group having a C═O bond include a benzophenone group, coumarin group, anthraquinone group, and maleimide group. These groups may have a substituent group such as an alkyl group, an alkoxy group, an aryl group, an allyloxy group, a cyano group, an alkoxycarbonyl group, a hydroxyl group, a sulfonic acid group, or a halogenated alkyl group.

Among them, a photoreactive group involved in a photodimerization reaction is preferable, and a cinnamoyl group and a chalcone group are preferable because a photo-orientation film, having a relatively small irradiation amount of polarized light necessary for photo orientation and being excellent in thermal stability and over-time stability, can be easily obtained. It is particularly preferable to adopt, as the photo-orienting polymer, a polymer having a cinnamoyl group such that the end of the side chain of the polymer has a cinnamic acid structure.

By applying the composition for photo-orientation film formation onto a surface on which the orientation film such as the first protective layer is to be formed, a photo-orientation induction layer can be formed. Examples of the solvent contained in the composition include the same solvents as those exemplified above as the solvent that can be used for the composition for protective layer formation, and the solvent can be appropriately selected depending on the solubility and the like of the photo-orienting polymer.

The content of the photo-orienting polymer in the composition for photo-orientation film formation can be appropriately adjusted depending on the type thereof and the thickness of the target photo-orientation film, and the content thereof is preferably at least 0.2% by mass, and more preferably within the range from 0.3 to 10% by mass, based on the mass of the composition for photo-orientation film formation. The composition for photo-orientation film formation may contain a polymer material such as polyvinyl alcohol or polyimide and a photosensitizer to an extent that the characteristics of the photo-orientation film are not significantly deteriorated.

Examples of the method of applying the composition for photo-orientation film formation and the method of removing the solvent from the applied composition for photo-orientation film formation include the same methods as the method of applying the composition for protective layer formation and the method of removing the solvent.

The manner of polarized light irradiation may be a manner of directly irradiating a coating film of the composition for photo-orientation film formation, from which the solvent has been removed, with polarized UV, or a manner of irradiating the surface side on which the coating film is formed with polarized light, thereby transmitting the polarized light. It is particularly preferable that the polarized light is substantially parallel light. The wavelength of the polarized light for irradiation preferably falls within a wavelength region in which the photo-reactive group of the photo-orienting polymer can absorb light energy. Specifically, UV (ultraviolet ray) having a wavelength within the range from 250 to 400 nm is particularly preferable. Examples of the light source to be used for irradiating the polarized light include a xenon lamp, high-pressure mercury lamp, ultra-high-pressure mercury lamp, metal halide lamp, and ultraviolet light laser such as KrF or ArF. A high-pressure mercury lamp, ultra-high-pressure mercury lamp, and metal halide lamp are more preferable. Among them, a high-pressure mercury lamp, ultra-high-pressure mercury lamp, and metal halide lamp are preferable because they have a high emission intensity of an ultraviolet ray having a wavelength of 313 nm. Polarized UV can be irradiated by irradiating the light from the light source through an appropriate polarizer. As such a polarizer, a polarizing filter, polarizing prisms of Glan-Thomson and Glan-Taylor, and a wire-grid type polarizer are usable.

When masking is performed during rubbing or polarized light irradiation, a plurality of regions (patterns), where the directions of liquid crystal orientation are different, can be formed.

The number average molecular weight of the photo-orientation film is preferably 20,000 to 100,000, more preferably 25,000 or more, and more preferably 90,000 or less, still more preferably 80,000 or less. When the number average molecular weight of the photo-orientation film is within the above range, adhesion to a layer adjacent to the photo-orientation film is easily improved. The number average molecular weight of the photo-orientation film can be controlled by the amount of the monomer used in the composition for photo-orientation film formation, the type and amount of the polymerization initiator, and the like.

The "number average molecular weight of the photo-orientation film" herein substantially corresponds to the number average molecular weight of the polymer constituting the cured photo-orientation film, and is a molecular weight calculated by measuring the cured photo-orientation film itself using a measuring instrument such as gel permeation chromatography.

A groove orientation film is a film having an unevenness pattern or multiple grooves on its surface. When a polymerizable liquid crystal compound is applied on a film having multiple linear grooves at equal intervals, the liquid crystal molecules are oriented in the direction along the grooves.

Examples of a method for obtaining the groove orientation film include a method in which after exposure on a surface of a photoreactive polyimide film through an exposure mask having a slit in a pattern form, development and rinsing treatments are carried out to form an unevenness pattern; a method in which a UV-curable resin layer before cured is formed on a plate-shaped base board having grooves on its surface, and the formed resin layer is transferred onto a surface on which an orientation layer is to be formed and then cured; and a method in which a film of a UV-curable resin before cured, which is formed on a surface on which an orientation layer is to be formed, is pressed onto a roll-shaped base board having multiple grooves to form unevenness and then cured.

The thickness of the orientation layer (orientation film containing an orientational polymer or photo-orientation film) is usually 10 to 5000 nm, preferably 10 to 1000 nm, more preferably 10 to 500 nm, still more preferably 10 to 300 nm, and particularly preferably 30 to 300 nm. When the thickness of the orientation layer is in the above range, good adhesion can be exhibited at an interface with the light absorption anisotropic layer formed on the orientation layer, and an orientation regulating force can be exhibited, so that the light absorption anisotropic layer can be formed with high orientation order.

(Second Protective Layer)

When the optical laminate of the present invention has the second protective layer, as the second protective layer, the same configuration as that of the first protective layer can be mentioned. While the first protective layer is required to have a configuration contributing to improvement of the visibility correction transmittance in the second region of the light absorption anisotropic layer, the second protective layer is preferably configured to be able to contribute to surface protection of the light absorption anisotropic layer in which the second region is formed, and improvement of the diffusion preventing function of the dichroic dye and the heat resistance. In one aspect of the present invention, the first protective layer is preferably a cured resin layer formed from a composition containing an active energy ray-curable component, and the second protective layer is preferably a layer formed from a composition containing a water-soluble polymer, particularly a composition containing a vinyl alcohol-based polymer. It is preferable that the second protective layer is disposed adjacent to a surface of the light absorption anisotropic layer on the side opposite to the orientation layer since the function is easily sufficiently exhibited.

Although a range of a suitable thickness of the second protective layer is as described above, the thickness of the second protective layer is preferably the same as or thinner than the thickness of the first protective layer.

The second protective layer is preferably a layer stacked as one layer of the optical laminate on the light absorption anisotropic layer after the formation of the second region by laser irradiation. When the second protective layer is formed without being exposed to laser irradiation for forming the second region, the visibility correction transmittance of the obtained second region tends to be further improved.

(Other Layers)

The optical laminate of the present invention including the first protective layer, the orientation layer, and the light absorption anisotropic layer functioning as a polarizer in this order may further include a retardation layer having a ¼ wavelength plate function. The optical laminate having such a configuration can function as a circularly polarizing plate.

The retardation layer having the ¼ wavelength plate function preferably satisfies the formulas (2) and (3):

$$100 \text{ nm} \leq Re(550) \leq 150 \text{ nm} \quad (2)$$

$$Re(450)/Re(550) < 1 \quad (3)$$

[where $Re(\lambda)$ represents a front retardation value of the retardation layer for light with a wavelength of $\lambda$ nm.]

When the retardation layer has the front retardation value represented by the above (2), the retardation layer functions as a so-called λ/4 plate. The formula (2) is preferably 120 nm $Re \leq (550) \leq 150$ nm.

The retardation layer satisfying the above formula (3) has so-called reverse wavelength dispersibility and exhibits excellent polarizing performance. The value of Re (450)/Re (550) is preferably 0.93 or less, more preferably 0.88 or less, still more preferably 0.86 or less, and preferably 0.80 or more, and more preferably 0.82 or more.

The front retardation value can be adjusted by a film thickness dA of the retardation layer. Since the front retardation value is determined by the formula $Re(\lambda)=(nx(\lambda)-ny(\lambda))\times dA$ [dA represents a thickness of the retardation layer, nx represents a main refractive index at a wavelength $\lambda$ nm in a direction parallel to a plane of the retardation layer in a refractive index ellipsoid formed by the retardation layer, and ny represents a refractive index at the wavelength $\lambda$ nm in a direction parallel to the plane of the retardation layer and orthogonal to the direction of nx in the refractive index ellipsoid formed by the retardation layer], a three-dimensional refractive index and the film thickness dA may be adjusted in order to obtain a desired front retardation value (Re ($\lambda$): in-plane retardation value of retardation layer at wavelength $\lambda$ (nm)).

Although the retardation layer may be a stretched film that gives a retardation by stretching a polymer, from the viewpoint of thinning the circularly polarizing plate, it is preferable that the retardation layer is a cured product of a polymerizable liquid crystal composition containing a polymerizable liquid crystal compound, and includes a polymer in an orientation state of the polymerizable liquid crystal compound. The retardation layer constituting the optical laminate of the present invention can be produced by appropriately selecting and adopting materials and methods conventionally known in the art, and as the polymerizable liquid crystal compound for forming the retardation layer, for example, a liquid crystal compound described in JP-A-2011-207765 and the like can be used.

The thickness of the retardation layer can be appropriately selected according to a display device to which the optical laminate is applied, and is preferably 0.1 to 10 μm, more preferably 1 to 5 μm, and still more preferably 1 to 3 μm from the viewpoint of thinning, flexibility, and the like.

The retardation layer may be bonded to an optical laminate including the first protective layer, the orientation layer, and the light absorption anisotropic layer in this order and capable of functioning as a polarizing plate on either the first protective layer side or the light absorption anisotropic side. The optical laminate including a retardation is obtained, for example, by transferring the optical laminate including the first protective layer, the orientation layer, and the light absorption anisotropic layer in this order to a laminate including a retardation layer, and the optical laminate which can function as a polarizing plate and the retardation layer may be bonded to each other with an adhesive layer interposed therebetween. An angle formed by a slow axis of the retardation layer and an absorption axis of the light absorption anisotropic layer (polarizing layer) is preferably 45°±5°.

The adhesive layer for bonding the optical laminate including the first protective layer, the orientation layer, and the light absorption anisotropic layer in this order and the retardation layer is not particularly limited, and as an adhesive for forming the adhesive layer, a pressure-sensitive adhesive and/or an adhesive conventionally known in the art can be used. Examples of the pressure-sensitive adhesive include pressure-sensitive adhesives having a base polymer such as an acrylic polymer, a rubber-based polymer, a urethane-based polymer, a silicone-based polymer, or a polyvinyl ether-based polymer. Alternatively, an energy ray-curable pressure-sensitive adhesive, a thermosetting pressure-sensitive adhesive, or the like may be used. Examples of the adhesive include an active energy ray-curable adhesive, an aqueous adhesive, an organic solvent-based adhesive, and a solventless adhesive.

The thickness of the adhesive layer is not particularly limited, and is usually 1 to 40 μm, preferably 3 to 25 μm.

[Method of Producing Optical Laminate]

The optical laminate of the present invention including the first protective layer, the orientation layer, and the light absorption anisotropic layer in this order can be produced, for example, by a method including: a step of irradiating a laminate including, in this order, a base material, the protective layer having a thickness of 5 μm or less, the orientation layer, and the light absorption anisotropic layer, which is a layer including a liquid crystal composition containing a dichroic dye, with a laser having a wavelength of 300 nm to 800 nm to form a region having a lower content of the dichroic dye than other regions in the layer including the liquid crystal composition (this step is hereinafter also referred to as the "pattern forming step"); and a step of peeling off the base material after the step of irradiating with the laser (this step is hereinafter also referred to as the "base material peeling step").

Therefore, the present invention is also directed to the above production method.

The pattern forming step is a step of forming at least two regions having different visibility correction transmittances in the layer including the liquid crystal composition containing the dichroic dye. A laminate including the base material, the protective layer having a thickness of 5 μm or less, the orientation layer, and the light absorption anisotropic layer, which is the layer including the liquid crystal composition containing the dichroic dye, in this order can be produced, for example, by forming the first protective layer, the orientation layer, and the light absorption anisotropic layer in this order on the base material according to the above description regarding the first protective layer, the orientation layer, and the light absorption anisotropic layer.

In the present invention, since the base material used in the pattern forming step is finally peeled off, the base material is stacked so as to be peelable in the laminate. The base material is not particularly limited as long as it can support the first protective layer, the light absorption anisotropic layer, and the orientation layer when the optical laminate is produced, and a base material known in the art can be used. Examples of the base material include a glass base material and a resin base material, and a resin base material is preferable from the viewpoint of easy continuous production of a long optical laminate.

Examples of the resin constituting the resin base material include plastics, for example, polyolefins such as polyethylene, polypropylene, and norbornene-based polymer; a cycloolefin-based resin; polyvinyl alcohol; polyethylene terephthalate; polyesters such as polybutylene terephthalate and polyethylene naphthalate; a polymethacrylic acid ester; a polyacrylic acid ester; cellulosic resins such as triacetyl cellulose, diacetyl cellulose, and cellulose acetate propionate; polycarbonate; polysulfone; polyether sulfone; polyether ketone; polyphenylenesulfide and polyphenylene oxide. Among these resins, from the viewpoint of smoothness and quality as a coating substrate, at least one selected from a cellulose-based resin, a cycloolefin-based resin, and a polyester-based resin (particularly, polyethylene terephthalate resin) is preferable. These resins may be used alone, or two or more kinds of them may be used in combination. Such a resin can be formed into a film by a conventional means such as a solvent casting method or a melt extrusion method to obtain a resin film base material. From the viewpoint of improving the peelability of the base material, the base material surface on the first protective layer side may be subjected to release treatment.

The thickness of the base material is preferably 15 μm or more, more preferably 20 μm or more, still more preferably 30 μm or more, and usually 100 μm or less from the viewpoint of securing moderate rigidity capable of functioning as the base material and easy peelability.

From the viewpoint of easily securing high visibility correction transmittance in the second region, a thickness (T1) of the first protective layer and a thickness (T2) of the base material preferably satisfy the following formula (1):

$$T1/T2 \leq 0.3 \tag{1}.$$

The value of T1/T2 is more preferably 0.25 or less, and still more preferably 0.2 or less.

In the pattern forming step, it is preferable that the base material and the first protective layer are present adjacent to each other, it is preferable that a layer having a thickness of more than 5 μm is not included in addition to the base material, the first protective layer, the orientation layer, and the light absorption anisotropic layer, and it is more preferable that a layer having a thickness of 3 μm or more, or 2 μm or more is not included.

In order to form a region having a lower content rate of the dichroic dye than other regions in the layer including the liquid crystal composition, that is, a region corresponding to the second region in the optical laminate of the present invention, the pattern forming step includes a step of irradiating a region where the region is to be provided with a laser having a wavelength of 300 nm to 800 nm The laser is not particularly limited, and a solid laser such as a YAG laser, a YLF laser, a YVO4 laser, or a titanium sapphire laser can be used.

In the above step, the wavelength of the laser can be appropriately selected depending on the composition and thickness of the layer including the liquid crystal composition to be irradiated. The wavelength is preferably 350 nm or more, more preferably 400 nm or more, and is preferably 750 nm or less, more preferably 700 nm or less.

The irradiation condition of laser beam can be appropriately selected depending on the composition and thickness of the layer including the liquid crystal composition to be irradiated, a laser device, and the like; however, when a solid laser is used, the laser power is preferably 0.3 W or more, more preferably 0.5 W or more, and preferably 10 W or less, more preferably 5 W or less. The switch frequency is preferably 1000 Hz or higher, more preferably 15000 Hz or higher, and preferably 1 million Hz or lower, more preferably 300,000 Hz or lower. The scan speed is preferably 100 mm/sec or more, more preferably 200 mm/sec or more, and preferably 10,000 mm/sec or less, preferably 5000 mm/sec or less. By performing irradiation under such conditions, it is possible to efficiently form a region in which the content of the dichroic dye is reduced while suppressing thermal damage.

After the step of laser irradiation, the base material is peeled off to obtain the optical laminate including the first protective layer, the orientation layer, and the light absorption anisotropic layer in this order. After the base material is peeled off, for example, an adhesive layer is provided on an outer layer surface of the laminate appearing by the base material peeling off, and the laminate can be bonded to a retardation layer, an organic EL element, and the like. In addition, another layer may be bonded to an outermost layer on the light absorption anisotropic layer side with an adhesive layer interposed therebetween, and for example, a front plate with a pressure-sensitive adhesive layer or the like may be bonded.

When the optical laminate of the present invention has the second protective layer on the surface of the light absorption anisotropic layer on the side opposite to the orientation layer, the second protective layer is preferably formed on the light absorption anisotropic layer after the step of performing laser irradiation. When the second protective layer is formed after the laser irradiation step for forming the second region, higher visibility correction transmittance in the second region can be realized as compared with a case where the second protective layer is formed in advance on the light absorption anisotropic layer and the laminate is irradiated with laser.

Therefore, the method of producing an optical laminate of the present invention may further include, after the step of irradiating with the laser, a step of forming the second protective layer on the surface of the light absorption anisotropic layer on the side opposite to the orientation layer.

The optical laminate of the present invention can be used in various display devices.

The display device means a device having a display element, and includes a light emitting element or a light emitting device as a light emitting source. Examples of the display device include a liquid crystal display device, organic electroluminescence (EL) display device, inorganic electroluminescence (EL) display device, touch panel display device, electron emission display device (for example, electric field emission display device (FED), surface electric field emission display device (SED), electronic paper (display device using electronic ink or electrophoretic element), plasma display device, projection type display device (for example, grating light valve (GLV) display device, display device with digital micromirror device (DMD)), piezoelectric ceramic display, etc. The liquid crystal display device may be a transmissive liquid crystal display, a semi-transmissive liquid crystal display, a reflective liquid crystal display, a direct viewing liquid crystal display or a projection liquid crystal display. These display devices may also be display devices displaying a two-dimensional image or stereoscopic display devices displaying a three-dimensional image.

The optical laminate of the present invention is a laminate patterned in regions having different visibility correction transmittances. For example, while high polarizing performance is secured in the first region, the second region can be used as a region corresponding to a lens position of a camera provided in a smartphone, a tablet, or the like, and the optical laminate can hold a high camera function.

EXAMPLES

The present invention will be described more specifically based on examples. However, the present invention is not limited to these Examples. "%" and "part(s)" in Examples and Comparative Examples refer to % by mass and part(s) by mass, unless otherwise described.

(Visibility Correction Transmittance (Ty), Visibility Correction Polarization Degree (Py))

The visibility correction transmittance (Ty) and the visibility correction polarization degree (Py) of each sample were measured and calculated by the following procedure.

Procedure: The transmittance ($T_1$) in the transmission axis direction and the transmittance ($T_2$) in the absorption axis direction in a wavelength range of 380 nm to 780 nm were measured by a double beam method using a device in which a folder with a polarizer was set in a spectrophotometer (UV-3150, manufactured by Shimadzu Corporation). In the folder, a mesh for cutting a light amount by 50% was installed on a reference side. The measurement diameter in each region was narrowed to a diameter of 10 mm (circle). The transmittance and the polarization degree at each wavelength were calculated using the following formulas (Formula 1) and (Formula 2), and in addition, the visibility was corrected by a 2-degree visual field (C light source) of JIS Z 8701, whereby the visibility correction transmittance (Ty) and the visibility correction polarization degree (Py) were calculated.

$$\text{Transmittance } [\%] = (T_1 + T_2)/2 \quad \text{(Formula 1)}$$

$$\text{Polarization degree } [\%] = \{(T_1 - T_2)/(T_1 + T_2)\} \times 100 \quad \text{(Formula 2)}$$

1. Example 1

(1) Preparation of Composition for First Protective Layer Formation

The following components were mixed and stirred at 80° C. for 1 hour to prepare a composition for first protective layer formation.

Acrylate compound: Dipentaerythritol hexaacrylate 50 parts

Urethane acrylate compound: Urethane acrylate ("EBECRYL 4858" manufactured by DAICEL-ALLNEX LTD., number of functional groups 2) 50 parts Radical polymerization initiator: 2-[4-(Methylthio)benzoyl]-2-(4-morpholinyl)propane ("IRGACURE 907" manufactured by BASF SE) 3 parts Solvent: Methyl ethyl ketone 10 parts (2) Preparation of Composition for Orientation Layer Formation 2 parts of a polymer represented by the following chemical formula and having a number average molecular weight of 28000 and 98 parts of o-xylene as a solvent were mixed, and the resulting mixture was stirred at 80° C. for 1 hour to obtain a composition for orientation layer formation.

[Chemical Formula 13]

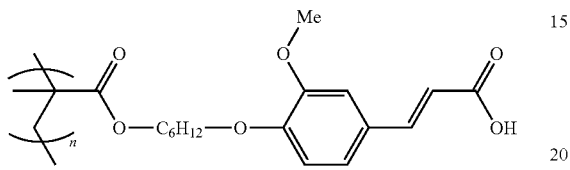

[where Me represents a methyl group.]

(3) Preparation of Composition for Light Absorption Anisotropic Layer Formation

The following components were mixed and stirred at 80° C. for 1 hour to obtain a composition for light absorption anisotropic layer formation. As the dichroic dye, the azo dye described in Examples of JP-A-2013-101328 was used.

Polymerizable liquid crystal compound (λ-6) 75 parts

[Chemical Formula 14]

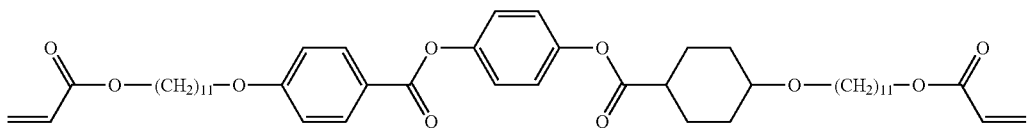

Polymerizable liquid crystal compound (λ-7) 25 parts

[Chemical Formula 15]

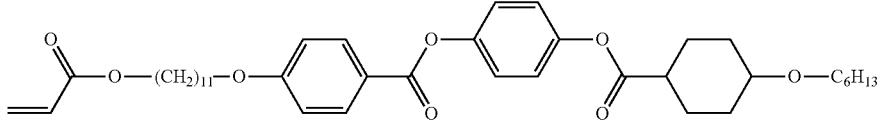

Dichroic dye (Ia) shown below 2.8 parts

[Chemical Formula 16]

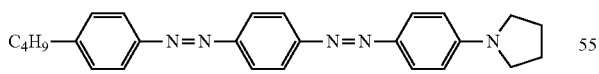

Dichroic dye (Ib) shown below 2.8 parts

[Chemical Formula 17]

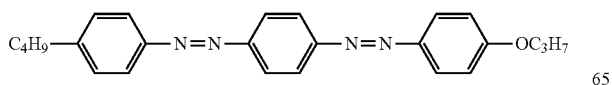

Dichroic dye (Ic) shown below 2.8 parts

[Chemical Formula 18]

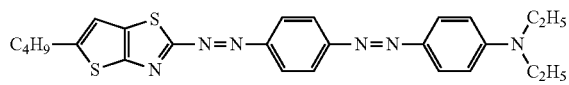

Polymerization Initiator: 2-dimethylamino-2-benzyl-1-(4-morpholinophenyl)butane-1-one (Irgacure 369; manufactured by Ciba Specialty Chemicals) 6 parts Leveling Agent: polyacrylate compound (BYK-361N; manufactured by BYK-Chemie) 1.2 parts Solvent: cyclopentanone 250 parts (4) Production of Optical Laminate (Polarizing Plate)

A release-treated surface of a polyethylene terephthalate film (SP-PLR 382050 manufactured by LINTEC Corporation, 40 μm) (base material layer) subjected to a release treatment was subjected to a corona treatment, and then a composition for first protective layer formation was applied by a bar coating method (#2 30 mm/s). Next, a coating film of the composition for first protective layer formation was irradiated with ultraviolet rays in an exposure amount of 500 mJ/cm$^2$ (standard 365 nm) using a UV irradiation device (SPOT CURE SP-7; manufactured by Ushio Inc.) to obtain a laminate in which the first protective layer was formed on a surface of a peelable PET film. The thickness of the first protective layer measured with a contact-type thickness meter was 2 μm.

The first protective layer of the obtained laminate was subjected to a corona treatment, and the composition for orientation layer formation was applied onto the corona-treated surface using a bar coater. Subsequently, the laminate was dried in a drying oven set at 120° C. for 1 minute to obtain a coating layer for an orientation layer (dried coating film). The coating layer for an orientation layer was irradiated with polarized UV in an integrated light amount of 50 mJ/cm$^2$ (standard 313 nm) using a polarized UV irradiation device (SPOT CURE SP-7; manufactured by Ushio Inc.) to form an orientation layer having a thickness of 100 nm.

The composition for light absorption anisotropic layer formation was applied onto the obtained orientation layer using a bar coater, and then dried in a drying oven set at 110° C. for 1 minute. Thereafter, ultraviolet rays were irradiated (under a nitrogen atmosphere, wavelength: 365 nm, integrated light amount at wavelength of 365 nm: 1000 mJ/cm$^2$) using a high pressure mercury lamp (Unicure VB-15201 BY-A, manufactured by Ushio Inc.) to form a light absorption anisotropic layer which was a layer in which a liquid crystal compound and a dichroic dye were oriented, thereby obtaining an optical laminate including the base material layer, the first protective layer, the orientation layer, and the light absorption anisotropic layer in this order. The thickness of the light absorption anisotropic layer was 2 μm.

In the light absorption anisotropic layer of the obtained laminate, the visibility correction transmittance (Ty1) was 42%, and the visibility correction polarization degree (Py1) was 98%. As a result of performing X-ray diffraction measurement on this light absorption anisotropic layer, the Bragg peak was obtained, and it was confirmed that a structure reflecting the higher order smectic phase was formed.

(Pattern Formation)

A specific region of the obtained laminate was irradiated with a laser of 532 nm at an output of 3.2 W, a switch frequency of 100,000 Hz, and a scan speed of 1000 mm/sec using a laser marker manufactured by Keyence Corporation from the light absorption anisotropic layer side to obtain a patterned laminate. In the obtained laminate, a region (second region) formed by laser irradiation was circular (diameter: 10 mm), the visibility correction transmittance (Ty2-1) was 86%, and the visibility correction polarization degree (Py2) was 0%. The thickness of each of the light absorption anisotropic layer, the orientation layer, and the first protective layer irradiated with the laser did not change greatly from the thickness of each layer before laser irradiation, and the difference in thickness between the first region and the second region of the light absorption anisotropic layer and the difference in thickness between the first region and the second region as the optical laminate were all within 0.5 μm.

A pressure-sensitive adhesive (acrylic pressure-sensitive adhesive, thickness as adhesive layer: 15 μm) was stacked on the patterned light absorption anisotropic layer side of the obtained patterned laminate, and a triacetyl cellulose film (TAC film) was bonded to the pressure-sensitive adhesive layer to obtain a transfer laminate. The base material was peeled off from the transfer laminate obtained by the bonding at an interface between the base material layer and the first protective layer. The visibility correction transmittance (Ty2-2) of the second region of the transfer laminate after peeling was measured and found to be 91%.

(5) Heat Resistance Test

The obtained patterned laminate was heated at 85° C. dry for 240 hours, and then the visibility correction transmittance of the second region was measured again to calculate an amount of change A (%) before and after the heat resistance test. Results are shown in Table 1.

2. Example 2

Preparation of Water-Soluble Polymer-Containing Composition 7 parts of carboxyl group-modified polyvinyl alcohol ["KURARAY POVAL KL 318" manufactured by KURARAY CO., LTD.] and 3.5 parts of a water-soluble polyamide epoxy resin ["Sumirez Resin 650" (aqueous solution having a solid content concentration of 30% by mass) obtained from Sumika Chemtex Co., Ltd.] as a thermal crosslinking agent were added to and mixed with 100 parts of water to prepare a water-soluble polymer-containing composition for second protective layer formation.

A patterned laminate was prepared in the same manner as in Example 1, then the prepared water-soluble polymer-containing composition was applied to the surface on the light absorption anisotropic layer side with a bar coater, and dried at 80° C. for 5 minutes to form a 1 μm second protective layer composed of a water-soluble polymer film, thereby obtaining a laminate including the base material layer, the first protective layer, the orientation layer, a light absorption anisotropic layer, and the second protective layer. The obtained laminate was evaluated in the same manner as in Example 1. The transferred laminate includes the first protective layer, the orientation layer, the light absorption anisotropic layer, the second protective layer, a pressure-sensitive adhesive layer, and a TAC film. Results are shown in Table 1.

3. Example 3

An optical laminate including the base material layer, the first protective layer, the orientation layer, and the light absorption anisotropic layer in this order was produced in the same manner as in Example 1, and then the second protective layer was formed on the light absorption anisotropic layer in the order of formation of the second protective layer in Example 2. Subsequently, the second region was formed in the same procedure as in the pattern formation in Example 1 to obtain a laminate including the base material layer, the first protective layer, the orientation layer, the light absorption anisotropic layer, and the second protective layer. The thickness of each of the light absorption anisotropic layer, the orientation layer, the first protective layer, and the second protective layer irradiated with the laser did not change greatly from the thickness of each layer before laser irradiation, and the difference in thickness between the first region and the second region of the light absorption anisotropic layer and the difference in thickness between the first region and the second region as the optical laminate were all within 0.5 µm. The obtained laminate was evaluated in the same manner as in Example 1. The transferred laminate includes the first protective layer, the orientation layer, the light absorption anisotropic layer, the second protective layer, a pressure-sensitive adhesive layer, and a TAC film. Results are shown in Table 1.

4. Example 4

An optical laminate including the base material (peeled at the time of transfer), the first protective layer, the orientation layer, the light absorption anisotropic layer, a water-soluble polymer layer (aqueous adhesive layer), and a TAC film was prepared and evaluated in the same manner as in Example 1 except that a water-soluble polymer composition (7 parts of carboxyl group-modified polyvinyl alcohol ["KURARAY POVAL KL 318" manufactured by KURARAY CO., LTD.] and 3.5 parts of water-soluble polyamide epoxy resin ["Sumirez Resin 650" (aqueous solution having a solid content concentration of 30% by mass) obtained from Sumika Chemtex Co., Ltd.] as a thermal crosslinking agent added to and mixed with 100 parts of water) was used instead of a pressure-sensitive adhesive at the time of transfer of the patterned laminate, and the composition was dried at 80° C. for 5 minutes to bond a triacetyl cellulose film to a 1 µm layer including a water-soluble polymer. Results are shown in Table 1.

5. Example 5

Preparation of Composition for Cationic Polymerization Type Polymer Formation

A cationic polymerizable compound and a cationic polymerization initiator described below were mixed and then defoamed to prepare a composition for cationic polymerization type polymer formation. The cationic polymerization initiator was blended as a 50% by mass propylene carbonate solution, and the solid content thereof was shown.

1,6-Hexanediol diglycidyl ether (trade name: EX-212 L, manufactured by Nagase ChemteX Corporation) 25 parts 4-Hydroxybutyl vinyl ether 10 parts Bisphenol F epoxy resin (trade name: EXA-830 CRP, manufactured by DIC Corporation) 65 parts Cationic polymerization initiator (trade name: CPI-100 P, manufactured by San-Apro Ltd., 50% by mass solution) 3 parts An optical laminate including the base material (peeled at the time of transfer), the first protective layer, the orientation layer, the light absorption anisotropic layer, a cationic polymerization type polymer layer, and a TAC film was prepared and evaluated in the same manner as in Example 4 except that the composition for cationic polymerization type polymer formation was used instead of the water-soluble polymer composition, and ultraviolet rays in an exposure amount of 500 mJ/cm$^2$ (standard 365 nm) were irradiated using a UV irradiation device (SPOT CURE SP-7; manufactured by Ushio Inc.) to bond a triacetyl cellulose film to a layer of 1 µm including a cationic polymerization type polymer. Results are shown in Table 1.

6. Example 6

An optical laminate including the base material (peeled at the time of transfer), the first protective layer, the orientation layer, the light absorption anisotropic layer, a pressure-sensitive adhesive layer, and a COP film was prepared and evaluated in the same manner as in Example 5 except that a cycloolefin polymer film (COP film) was used instead of the triacetylcellulose film at the time of transfer of the patterned laminate. Results are shown in Table 1.

7. Example 7

An optical laminate including the base material (peeled at the time of transfer), the first protective layer, the orientation layer, the light absorption anisotropic layer, a pressure-sensitive adhesive layer, and a PMMA film was prepared and evaluated in the same manner as in Example 5 except that a polymethyl methacrylate polymer film (PMMA film) was used instead of the triacetylcellulose film at the time of transfer of the patterned laminate. Results are shown in Table 1.

8. Comparative Example 1

An optical laminate including the base material, the orientation layer, the light absorption anisotropic layer, a pressure-sensitive adhesive layer, and a TAC film was prepared and evaluated in the same manner as in Example 1 except that a triacetyl cellulose film was used instead of a polyethylene terephthalate film as a base material film and the first protective layer was not provided. Since the base material film could not be peeled off at the time of transfer, the heat resistance test was performed in a state of containing the base material. Results are shown in Table 1.

9. Comparative Example 2

An optical laminate including the base material, the orientation layer, the light absorption anisotropic layer, a pressure-sensitive adhesive layer, and a TAC film was prepared and evaluated in the same manner as in Comparative Example 1 except that a hole was formed in the laminate including the light absorption anisotropic layer using a punching punch instead of a laser marker during pattern formation. At the time of transfer, bubbles entered when the triacetyl cellulose film was bonded via a pressure-sensitive adhesive. Since the base material film could not be peeled off, the heat resistance test was performed in a state of containing the base material. Results are shown in Table 1.

TABLE 1

| | First region | | Second region | | | Heat resistance |
| --- | --- | --- | --- | --- | --- | --- |
| | | | Before transfer (with base material) | | After transfer (after peeling of base material) | 85° C. Dry 240 h Ty2 change |
| | Ty1 (%) | Py1 (%) | Ty2-1 (%) | Py2 (%) | Ty2-2 (%) | amount |
| Example 1 | 42 | 98 | 86 | 0 | 91 | Δ3% |
| Example 2 | 42 | 98 | 86 | 0 | 92 | Δ1% |
| Example 3 | 42 | 98 | 85 | 0 | 89 | Δ1% |
| Example 4 | 42 | 98 | 86 | 0 | 91 | Δ1% |
| Example 5 | 42 | 98 | 86 | 0 | 91 | Δ1% |
| Example 6 | 42 | 98 | 86 | 0 | 90 | Δ1% |
| Example 7 | 42 | 98 | 86 | 0 | 92 | Δ1% |
| Comparative Example 1 | 42 | 98 | 86 | 0 | Base material cannot be peeled off | Δ3% |
| Comparative Example 2 | 42 | 98 | Not measurable | — | Bubbles generated Base material cannot be peeled off | Δ3% |

What is claimed is:

1. An optical laminate comprising:
   at least a first region and a second region having different values of visibility correction transmittance; and
   a first protective layer having a thickness of 0.1 μm or more and 3 μm or less, an orientation layer, a light absorption anisotropic layer, and a second protective layer which is formed from a composition containing a vinyl alcohol-based polymer, and having a thickness of 0.1 μm or more and 3 μm or less provided in this order,
   wherein the first region has a periodic structure of molecular orientation,
   wherein the second region is a region in which the visibility correction transmittance is higher than that of the first region,
   wherein a difference in thicknesses between the first region and the second region is 2 μm or less,
   wherein a visibility correction transmittance in the first region is 35% or more,
   wherein a visibility correction transmittance in the second region is 87% or more,
   wherein the optical laminate does not include a base material layer on the side of the first protective layer opposite to the orientation layer, and
   the light absorption anisotropic layer is a layer including a liquid crystal composition containing a dichroic dye, and includes the first region and the second region.

2. The optical laminate according to claim 1, wherein both the first region and the second region include a layer configuration including the first protective layer, the orientation layer, and the light absorption anisotropic layer in this order.

3. The optical laminate according to claim 1, wherein
   the second region is a region having a circular, elliptical, oval, or polygonal shape in plan view,
   a diameter is 2 cm or less when the second region has a circular shape,
   a major diameter is 2 cm or less when the second region has an elliptical shape or an oval shape is 2 cm or less, and
   when the second region has a polygonal shape, a diameter of a virtual circle drawn such that the polygon is inscribed is 2 cm or less.

4. The optical laminate according to claim 1, wherein the orientation layer contains a photo-orienting polymer.

5. The optical laminate according to claim 1, wherein the first protective layer contains at least one selected from the group consisting of a vinyl alcohol-based polymer, a (meth) acryl-based polymer, and a urethane-based polymer.

6. The optical laminate according to claim 1, further comprising an adhesive layer adjacent to the first protective layer on a side of the protective layer opposite to the orientation layer.

7. The optical laminate according to claim 1, wherein the visibility correction transmittance in the second region is 90% or more.

8. The optical laminate according to claim 1, further comprising a retardation layer having a ¼ wavelength plate function.

* * * * *